United States Patent
Yabu

(10) Patent No.: US 6,873,397 B2
(45) Date of Patent: Mar. 29, 2005

(54) EXPOSURE APPARATUS, GAS REPLACING METHOD, AND METHOD OF MANUFACTURING A SEMICONDUCTOR DEVICE

(75) Inventor: Shuichi Yabu, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 196 days.

(21) Appl. No.: 09/811,447

(22) Filed: Mar. 20, 2001

(65) Prior Publication Data

US 2001/0028443 A1 Oct. 11, 2001

(30) Foreign Application Priority Data

Mar. 30, 2000 (JP) ........................................ 2000-093687

(51) Int. Cl.[7] ........................ G03B 27/52; G03B 27/42; G03B 27/54; G03B 27/32
(52) U.S. Cl. ............................. 355/30; 355/53; 355/67; 355/77
(58) Field of Search ............................. 355/30, 53, 67, 355/77; 359/507, 509, 512, 820; 250/492.2; 430/20, 30, 311

(56) References Cited

U.S. PATENT DOCUMENTS

| | | | |
|---|---|---|---|
| 5,399,448 A | | 3/1995 | Nagata et al. ................. 430/5 |
| 5,430,303 A | * | 7/1995 | Matsumoto et al. ..... 250/492.2 |
| 5,559,584 A | * | 9/1996 | Miyaji et al. .................. 355/30 |
| 5,696,623 A | * | 12/1997 | Fujie et al. .................... 355/30 |
| 5,892,572 A | | 4/1999 | Nishi ............................ 355/67 |
| 6,184,972 B1 | * | 2/2001 | Mizutani et al. ............... 355/72 |
| 6,191,843 B1 | * | 2/2001 | Takiguchi ..................... 355/30 |
| 6,252,648 B1 | * | 6/2001 | Hase et al. ............. 219/121.84 |
| 6,288,769 B1 | * | 9/2001 | Akagawa et al. .............. 355/30 |
| 6,295,121 B1 | * | 9/2001 | Nakamura ..................... 355/30 |
| 6,341,006 B1 | * | 1/2002 | Murayama et al. ....... 250/492.1 |
| 6,385,497 B1 | * | 5/2002 | Ogushi et al. .............. 700/109 |
| 6,414,743 B1 | * | 7/2002 | Nishi et al. .................... 355/53 |
| 6,545,746 B1 | * | 4/2003 | Nishi ............................ 355/53 |

FOREIGN PATENT DOCUMENTS

| | | | |
|---|---|---|---|
| EP | 1 143 491 A1 | * | 10/2001 |
| JP | 61-79228 | | 4/1986 |
| JP | 7-176477 | | 7/1995 |
| JP | 8-279458 | | 10/1996 |
| WO | WO 00/31780 | * | 6/2000 |

OTHER PUBLICATIONS

Korean Office Action dated Aug. 1, 2003, issued In a corresponding Korean pat nt application.

* cited by examiner

Primary Examiner—Alan Mathews
(74) Attorney, Agent, or Firm—Fitzpatrick, Cella, Harper & Scinto

(57) ABSTRACT

An exposure apparatus includes a chamber surrounding a predetermined space, a first gas supply unit for supplying a first gas into the chamber, a second gas supply unit for supplying a second gas, different from the first gas into the chamber, and a switching mechanism for supplying one of the first and second gases by switching between the first and second gas supply units.

87 Claims, 20 Drawing Sheets

FIG. 11

```
URL  http://www.maintain.co.jp/db/input.html
```

PROBLEM DB INPUT SCREEN

INPUT
TYPE          [* * * * * * * * *]  —1401

NAME OF
PROBLEM       [OPERATION FAILURE (START-UP ERROR)] —1403

DEVICE
S/N           [465NS4580001]  —1402

DEGREE OF
EMERGENCY     [D]  —1405

DATE OF
OCCURRENCE    [27 DEC 2000]  —1404

SIGN OF PROBLEM
              [LED LIT INTERMITTENTLY
               AFTER POWER IS SUPPLIED]  —1406

COUNTERMEASURE
              [SUPPLY POWER AGAIN
               (PRESS RED BUTTON AT START)]  —1407

PROGRESS
              [PROBLEM COUNTERED TENTATIVELY]  —1408

(SEND) (RESET)

1410                    1411                1412
LINK TO LIST OF         SOFTWARE LIBRARY    OPERATION GUIDE
DATA BASE OF RESULT

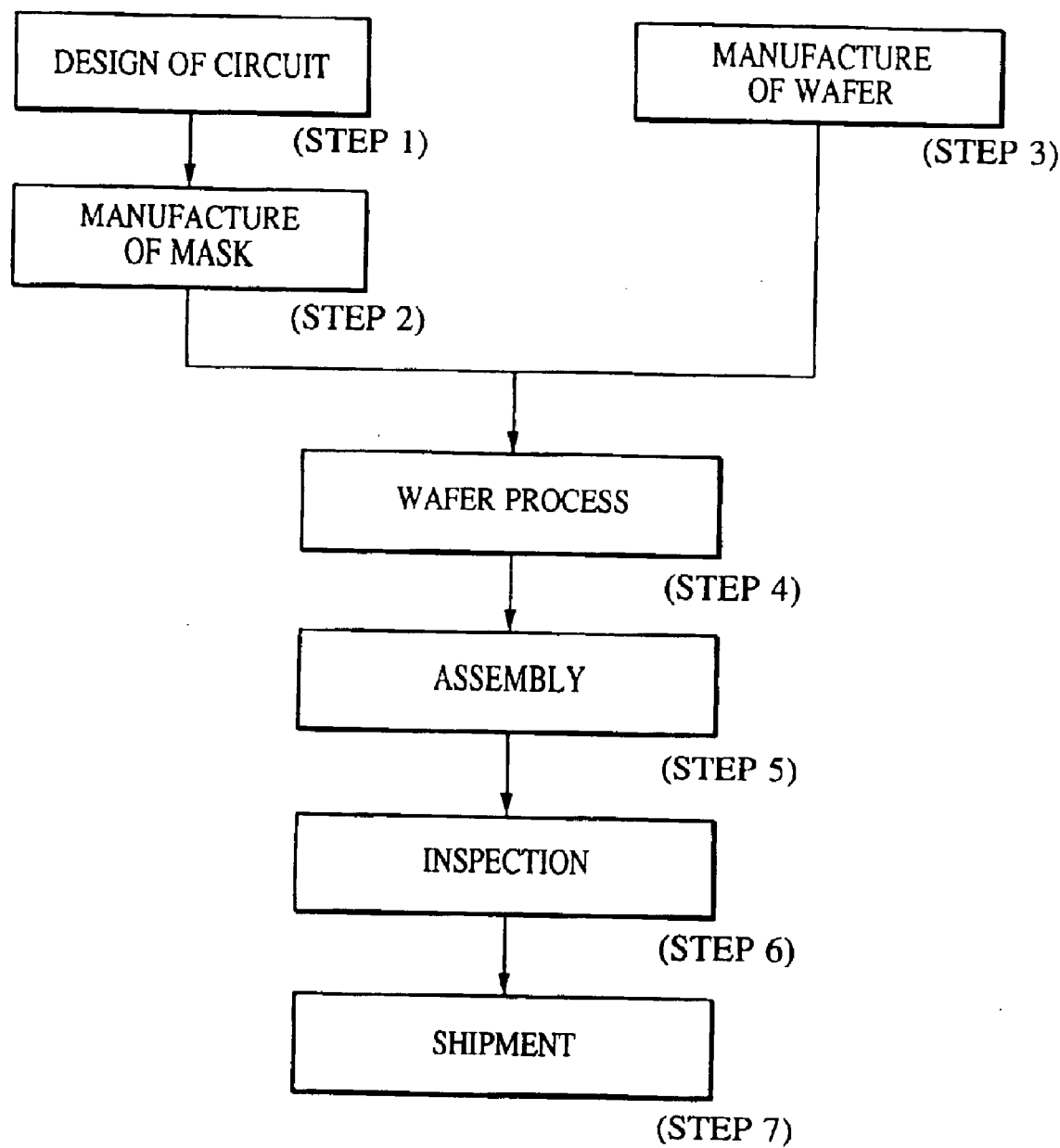

He

N₂

—— LOWER LEFT CORNER
--- LEFT CENTER PORTION
-·- RIGHT CENTER PORTION
-··- UPPER RIGHT CORNER
···· FLOWING-OUT PORT

He

N₂

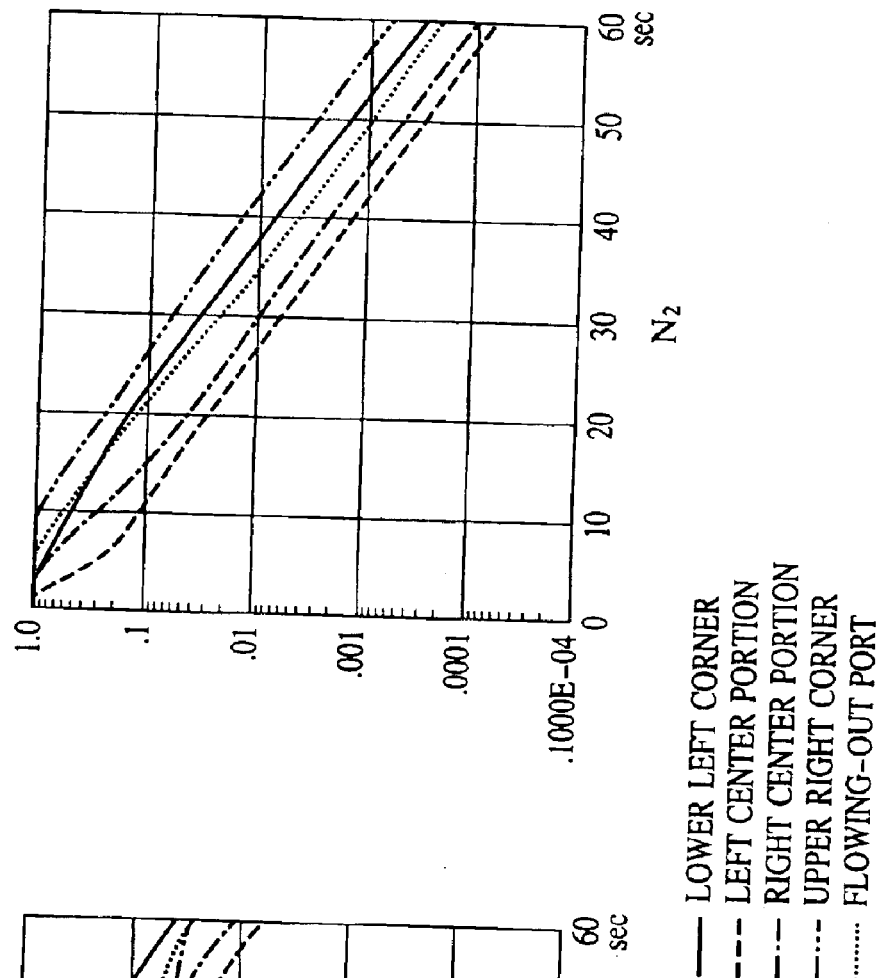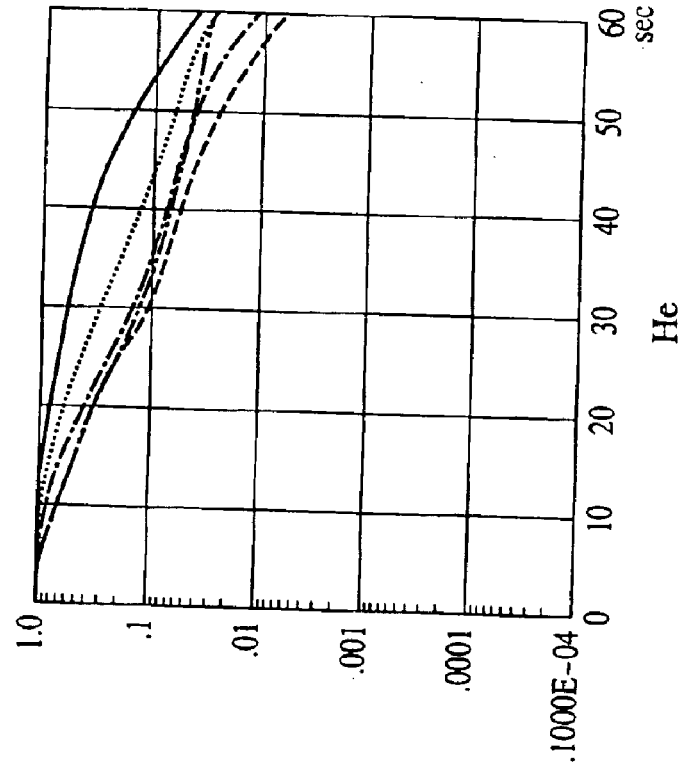

EXPOSURE APPARATUS, GAS REPLACING METHOD, AND METHOD OF MANUFACTURING A SEMICONDUCTOR DEVICE

BACKGROUND OF THE INVENTION

1. Field of the Invention

The present invention relates to a method of replacing a gas, and more particularly to a method of replacing an atmospheric gas, such as air, in the light path of vacuum ultraviolet light with an inactive gas, in a semiconductor exposure apparatus using the vacuum ultraviolet light as an illumination beam.

2. Description of the Related Art

A higher degree of resolution is required for an exposure apparatus such as a stepper and the like as semiconductors are integrated more densely and the size thereof becomes more miniaturized. Since resolution is proportional to a wavelength of exposure light, the wavelength of exposure light is being shortened step by step, and a g-line in the visible region (wavelength: 436 nm) is being replaced with an i-line in the ultraviolet region (wavelength: 365 nm) as well as, recently, a KrF excimer laser beam (wavelength: 248 nm) is being used, and the utilization of an ArF excimer laser beam (wavelength: 193 nm), an F2 laser beam (wavelength: 157 nm), and further, an Ar2 laser beam (wavelength: 126 nm) is being examined.

However, a laser beam in a wavelength region less than approximately the wavelength of the ArF excimer laser beam is absorbed by oxygen in air and the transmission of the laser beam is lowered. To cope with this problem, in an exposure apparatus using the ArE excimer laser beam, almost all the air in the light path of the exposure light is replaced with nitrogen. Further, since a laser beam is somewhat absorbed even by nitrogen in a wavelength region of approximately 190 nm or less (the vacuum ultraviolet region), nitrogen must be replaced with another gas i.e., an inactive gas other than nitrogen), which permits the laser beam to pass therethrough, or the interior of the exposure apparatus must be evacuated. However, in order to evacuate the exposure apparatus, the apparatus must be strongly constructed so as to withstand high pressure, increasing the manufacturing cost of the apparatus. Thus, a system for replacing the gas in the light path of the exposure light with any of other gases having a high degree of transmission is employed. It is contemplated to be most preferable to replace the atmosphere in the vicinity of the light path of the exposure light and the atmosphere in the vicinity of optical elements of the exposure apparatus with helium, in consideration of safety, good heat conductivity, a smaller change in reflective index due to temperature, and the like.

SUMMARY OF THE INVENTION

In view of the problem of the conventional example, it is an object of the present invention to instantly replace the air in a vessel, which hermetically seals the vicinity of the light path of exposure light in a semiconductor exposure apparatus, with another gas.

To achieve the above object, an exposure apparatus of the present invention includes a chamber surrounding a predetermined space, a first gas supply unit for supplying a first gas into the chamber, a second gas supply unit for supplying a second gas, different from the first gas, into the chamber, and a switching mechanism for supplying any of the first and second gases by switching the first and second gas supply units.

It is preferable that the first gas in the chamber be replaced with the second gas after the air in the chamber is replaced with the first gas.

It is preferable that the switching mechanism be a switching valve.

It is preferable that an amount of the first gas supplied per unit time be different from an amount of the second gas supplied per unit time.

It is preferable that the flow path of the first gas in the chamber be different from the flow path of the second gas in the chamber.

It is preferable that the gas supply port of the first gas in the chamber be different from the gas supply port of the second gas in the chamber.

It is preferable that the gas exhaust port of the first gas in the chamber be different from the gas exhaust port of the second gas in the chamber.

It is preferable that the ventilation port of the first gas in the chamber be disposed differently from the ventilation port of the second gas in the chamber.

It is preferable that the chamber partly surround the light path of the light from an illuminant in the vacuum ultraviolet region.

It is preferable that the illuminant be an illuminant of an F2 laser or Ar2 laser.

It is preferable that an optical element be contained in the chamber.

It is preferable that a plurality of optical elements be contained in the chamber.

It is preferable that the chamber surround a light path in the illumination optical system of the exposure apparatus.

It is preferable that the chamber surround the light path in the projection optical system of the exposure apparatus.

It is preferable that the chamber surround the projection optical system of the exposure apparatus.

It is preferable that the first and second gases contain substantially no oxygen.

It is preferable that the first and second gases have a different specific gravity.

It is preferable that the second gas be an inactive gas.

It is preferable that the first gas be an inactive gas.

It is preferable that the second gas be helium and the first gas be nitrogen.

A gas replacing method of the present invention includes the steps of supplying a first gas into a chamber surrounding a predetermined space and supplying a second gas, different from the first gas, into the chamber after the first gas has been supplied.

It is preferable that a gas be supplied into the chamber by switching a first gas supply unit for supplying the first gas and a second gas supply unit for supplying the second gas.

It is preferable that a valve be used to switch the first gas and the second gas.

It is preferable that an amount of the first gas supplied per unit time be different from an amount of the second gas supplied per unit time.

It is preferable that the flow path of the first gas in the chamber be different from the flow path of the second gas in the chamber.

It is preferable that the gas supply port of the first gas in the chamber be different from the gas supply port of the second gas in the chamber.

It is preferable that the gas exhaust port of the first gas in the chamber be different from the gas exhaust port of the second gas in the chamber.

It is preferable that the ventilation port of the first gas in the chamber be disposed differently from the ventilation port of the second gas in the chamber.

It is preferable that the chamber partly surround the light path of the light from an illuminant in the vacuum ultraviolet region.

It is preferable that the illuminant be an illuminant of an F2 laser or Ar2 laser.

It is preferable that an optical element be contained in the chamber.

It is preferable that a plurality of optical elements be contained in the chamber.

It is preferable that the chamber surround a light path in the illumination optical system of an exposure apparatus.

It is preferable that the chamber surround the light path in the projection optical system of an exposure apparatus.

It is preferable that the chamber surround the projection optical system of an exposure apparatus.

It is preferable that the first and second gases contain substantially no oxygen.

It is preferable that the first and second gases have a different specific gravity.

It is preferable that the second gas be an inactive gas.

It is preferable that the first gas be an inactive gas.

It is preferable that the second gas be helium and the first gas be nitrogen.

A method of manufacturing a semiconductor device of the present invention includes a step of installing a group of manufacturing apparatuses including the above-mentioned exposure apparatus, for performing various processes in a semiconductor manufacturing factory and a step of manufacturing the semiconductor devices in a plurality of processes using the group of manufacturing apparatuses.

It is preferable that the method of manufacturing a semiconductor device further include a step of connecting the group of manufacturing apparatuses though a local area network and a step of transmitting information as to at least one set of the group of manufacturing apparatuses between the local area network and an external network outside the semiconductor manufacturing factory by means of data communication.

It is preferable that maintenance information of the manufacturing apparatuses be obtained by accessing a database provided by a vendor or a user of the exposure apparatus through the external network by means of the data communication, or that production management be carried out by communicating data to a semiconductor manufacturing factory other than the above semiconductor manufacturing factory through the external network.

A semiconductor manufacturing factory of the present invention includes a group of manufacturing apparatuses for performing various processes, with each manufacturing apparatus including the above-mentioned exposure apparatus. The factory further includes a local area network for connecting the group of manufacturing apparatuses and a gateway for permitting access from the local area network to an external network outside the semiconductor manufacturing factory, wherein information as to at least one set of the group of manufacturing apparatuses is transmitted by means of data communication.

A maintenance method of an exposure apparatus of the present invention includes the steps of causing a vendor or a user of the exposure apparatus discussed above to provide a maintenance database connected to the external network of a semiconductor manufacturing factory, permitting access to the maintenance database from the semiconductor manufacturing factory through the external network, and transmitting information stored in the maintenance database to the semiconductor manufacturing factory through the external network.

In addition, it is preferable that the above-mentioned exposure apparatus further include a display, a network interface, and a computer for executing network access software, wherein the information of the exposure apparatus is transmitted through a computer network by means of data communication.

It is preferable that the network access software provide a user interface for accessing the maintenance database provided by the vendor or the user of the exposure apparatus connected to the external network of a factory in which the exposure apparatus is installed. The user interface is preferably provided on the display to make it possible to obtain information from the maintenance database through the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a view showing a screen displayed on a display unit;

FIG. 12 is a flowchart of a process for manufacturing a semiconductor device;

FIGS. 18A and 18B are graphs showing how the atmospheric concentrations change in the hermetically-sealed vessel at respective positions as time passes when gravity is taken into consideration;

DESCRIPTION OF THE PREFERRED EMBODIMENTS

Preferred embodiments of the present invention will now be described in detail with reference to the accompanying drawings.

In general, when air in the light path of exposure light is replaced with a gas, the light path is contained in a hermetically-sealed vessel, an end of the hermetically-sealed vessel is arranged as a gas supply port, the other end thereof is arranged as a gas exhaust port, and a flow path is formed so that the light path is entirely filled with the gas. Then, the air in the hermetically-sealed vessel is replaced with the gas by convection and diffusion of molecules.

As an example, a result of a simulation which was executed to replace the air in a hermetically-sealed vessel with nitrogen will be shown.

Figure 14:
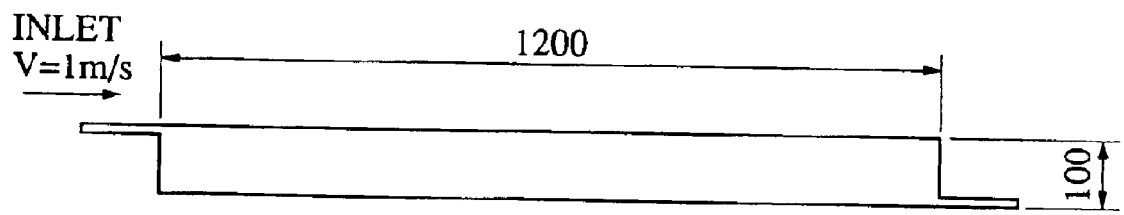
FIG. 14 is a view showing a simulation model of the interior of a hermetically-sealed vessel.

FIG. 14 shows a hermetically-sealed vessel used as a model for the simulation. At a time 0, the interior of the hermetically-sealed vessel is filled with air. The hermetically-sealed vessel has a gas supply port formed at an upper left portion in FIG. 14. A replacement gas is supplied into the hermetically-sealed vessel from the gas supply port. Further, the hermetically-sealed vessel has a gas exhaust port formed at a lower right portion in FIG. 14. When the replacement gas is supplied from the gas supply port, the air in the hermetically-sealed vessel is exhausted to outside of the hermetically-sealed vessel through the gas exhaust port. Note that, in the simulation, the replacement gas is supplied from the gas supply port from the time 0 at a flow rate of 1 m/sec. Conventionally, however, the behavior of the gas was simulated without taking the influence of gravity into consideration.

Figure 15A:
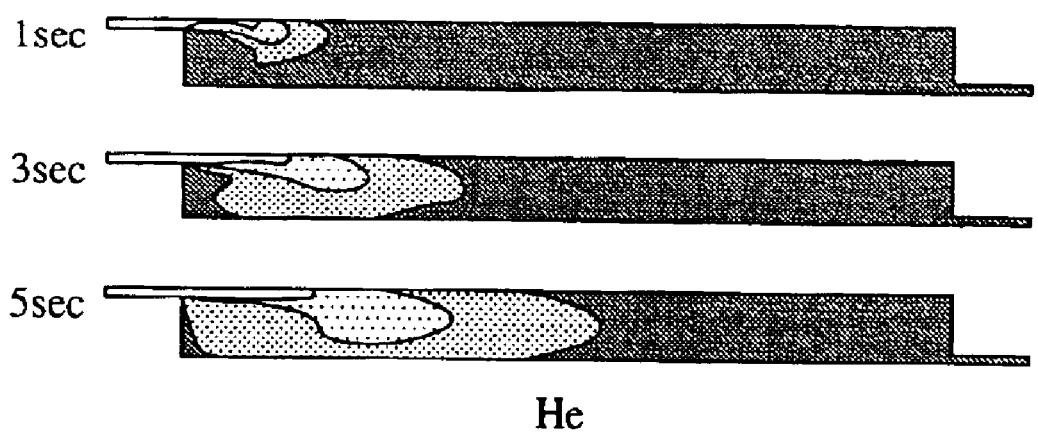
FIGS. 15A and 15B are views showing a result of a simulation of the atmospheric concentration in the hermetically-sealed vessel when gravity is not taken into consideration.
Figure 15B:
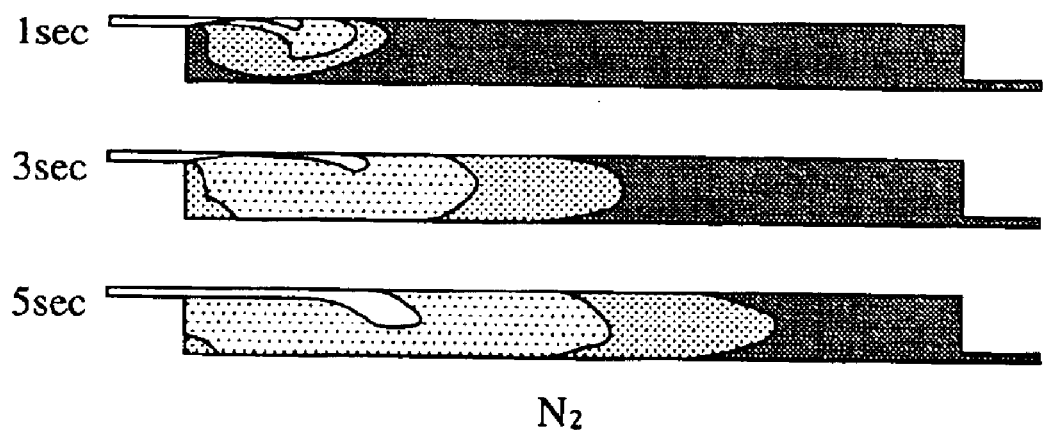

FIGS. 15A and 15B are views showing how the concentration of the air in the vessel changes as time passes, when it is assumed that the concentration of the air is not influenced by gravity. In FIGS. 15A and 15B, a pattern having a deeper color means that the air has a higher concentration. FIG. 15A shows a case in which helium is used as the replacement gas, whereas FIG. 15B shows a case in which nitrogen is used as the replacement gas.

Calculations in FIGS. 15A and 15B are made assuming that the replacement gas is not influenced by gravity. Thus, the convection of the gas in the vessel is carried out substantially similarly if either of helium and nitrogen is used, although they behave differently, in time.

Figures 16A, 16B:
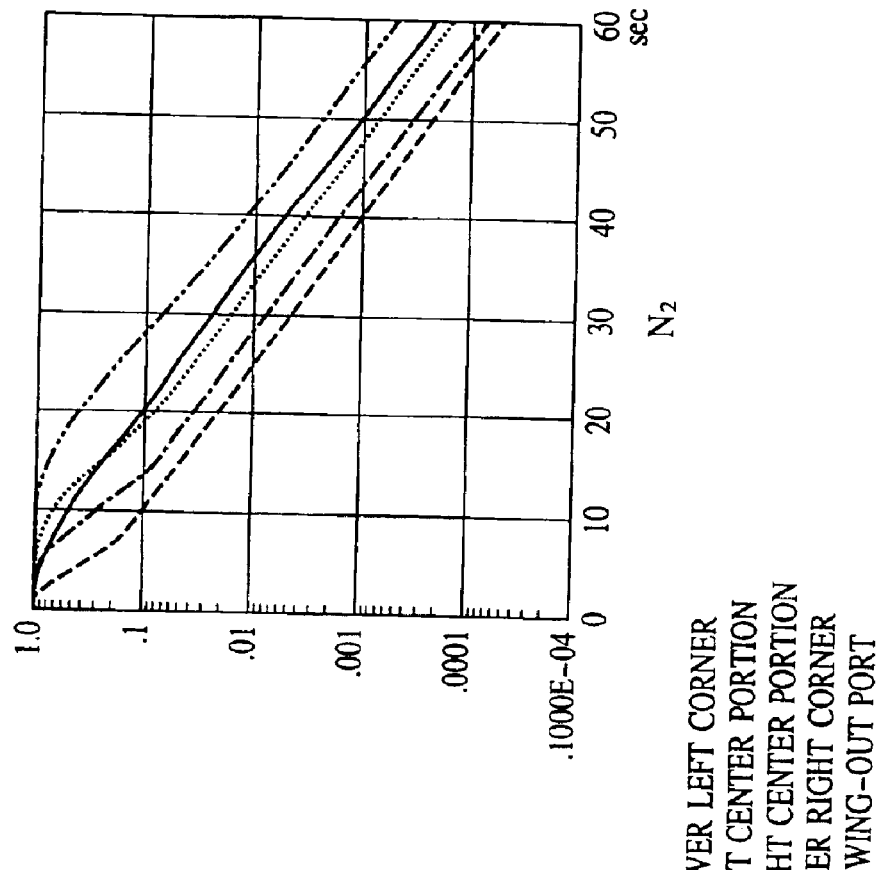
FIGS. 16A and 16B are graphs showing how the atmospheric concentrations in the hermetically-sealed vessel change at respective positions as time passes when gravity is not taken into consideration.

Further, FIGS. 16A and 16B are graphs showing how the concentrations of the air change as time passes at a lower left corner, a left center portion, a right center portion, an upper right corner and a flowing-out port in the vessel. In FIGS. 16A and 16B, the vertical axis shows the concentration of air (logarithmic scale) and the lateral axis shows time (real number scale). In FIG. 16A, helium is used as the replacement gas, whereas in FIG. 16B, nitrogen is used as the replacement gas.

Calculations in FIGS. 16A and 16B are made assuming that the replacement gas is not influenced by gravity. Thus, the change in concentration of the gas, which is caused as time passes, exhibits a substantially similar tendency if either of helium and nitrogen is used.

Note that the following points can be determined from the graphs. First, the air which existed in the vessel at the beginning is pushed out. At this step, the concentration of the air is changed less in the vicinity of the gas exhaust port. Next, the air diluted by convection is exhausted. At this step, the concentration of the original air is abruptly reduced exponentially. Thereafter, the speed at which the concentration thereof is reduced gradually slows. It is contemplated that this is because the replacement of the air in a portion where the air stagnates is mainly carried out by diffusion of molecules.

As described above, it has been contemplated that the behavior of helium in a vessel is similar to that of nitrogen as a result of a simulation which was carried out without taking the influence of gravity into consideration.

However, helium has a lower molecular weight and a specific gravity less than that of air (the atmosphere). As a result, the influence of gravity must be taken into consideration in order to accurately understand the behavior of helium in a vessel.

For this purpose, a simulation was carried out taking the influence of gravity into consideration.

Figure 17A:
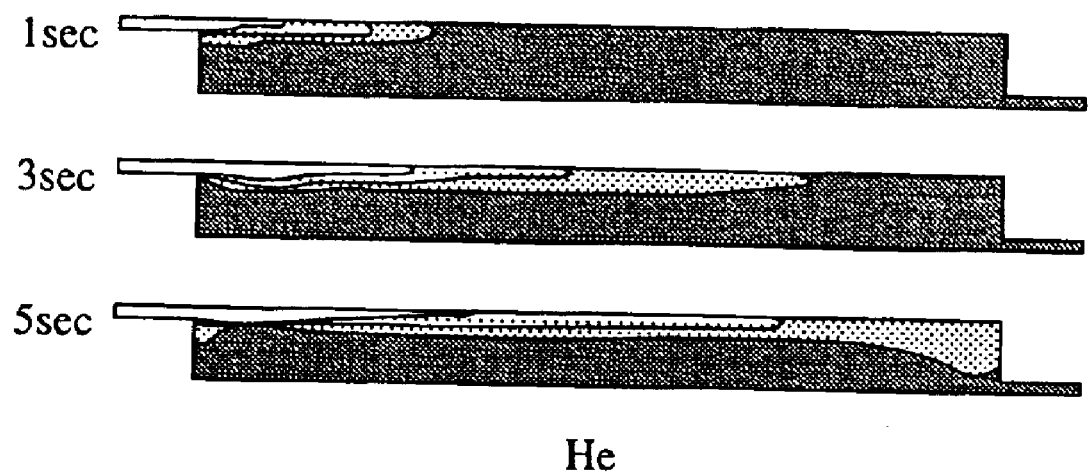
FIGS. 17A and 17B are views showing a result of a simulation of the atmospheric concentration in the hermetically-sealed vessel when gravity is taken into consideration.
Figure 17B:
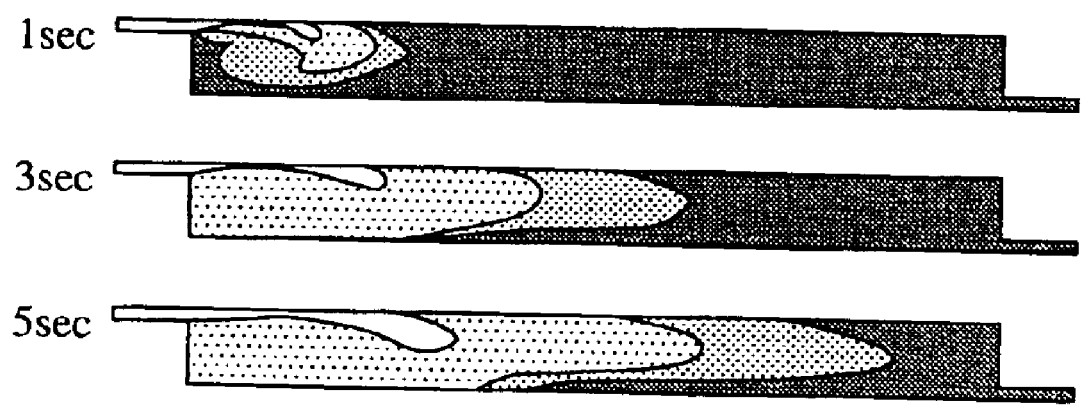

FIGS. 17A and 17B are views showing how the concentration of air in a vessel changes as time passes when the influence of gravity is taken into consideration. In FIG. 17A, helium is used as a replacement gas, whereas in FIG. 17B, nitrogen is used as the replacement gas.

FIG. 17B shows a state in which air is replaced with nitrogen. In FIG. 17B, nitrogen gas tends to spread in the vessel and to flow toward a gas exhaust port substantially similarly to the above-mentioned case in which the influence of gravity was not taken into consideration. It is contemplated that this is because nitrogen comprises a substantial portion of air and the specific gravity of nitrogen is approximately the same as that of air.

In contrast, FIG. 17A shows a state in which air is replaced with helium, and a tendency shown in FIG. 17A is entirely different from the case in which the influence of gravity was not taken into consideration. The behavior of helium in the above-mentioned case (in which the influence of gravity was not taken into consideration) is such that helium gas spreads in the vessel and flows therein so as to push out the air from the left side of the vessel. It can be found, however, that the behavior of helium in the case in which the influence of gravity is taken into consideration is such that helium flows through only an upper portion of the vessel. Therefore, it is difficult for helium to flow through a lower portion of the vessel.

FIGS. 18A and 18B are graphs showing how the concentration of the air in a vessel changes as time passes when the influence of gravity is taken into consideration. In FIGS. 18A and 18B, the vertical axis shows the concentration of air (logarithmic scale) and the lateral axis shows time (real number scale). In FIG. 18A, helium is used as the replacement gas, whereas in FIG. 18B, nitrogen is used as the replacement gas.

According to the graph shown in FIG. 18B, when nitrogen is used as the replacement gas, a tendency approximately similar to the above-mentioned case is exhibited. However, according to the graph shown FIG. 18A, when helium is used as the replacement gas, the concentration of air is more difficult to reduce. That is, it is difficult for the air in the vessel to be replaced with a helium atmosphere.

Figure 19:
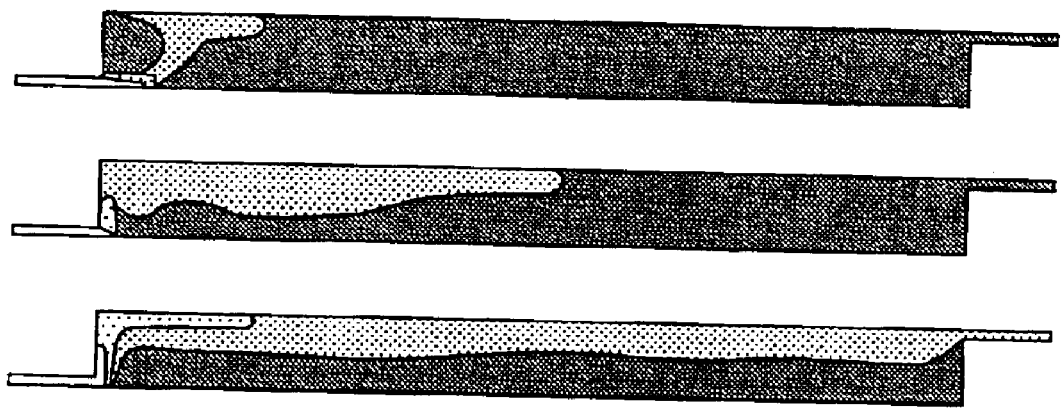
FIG. 19 is a view showing a result of a simulation of the atmospheric concentration in another hermetically-sealed vessel when gravity is taken into consideration.

FIG. 19 shows a state of convection of helium in a vessel when a gas supply port is disposed at a lower position, a gas exhaust port is disposed at an upper position, and helium is supplied from the gas supply port.

It can be found from FIG. 19 that the helium supplied from the gas supply port disposed at the lower portion of the vessel flows upward in the vessel, and then flows along the upper wall of the vessel toward the gas exhaust port.

Figure 20:
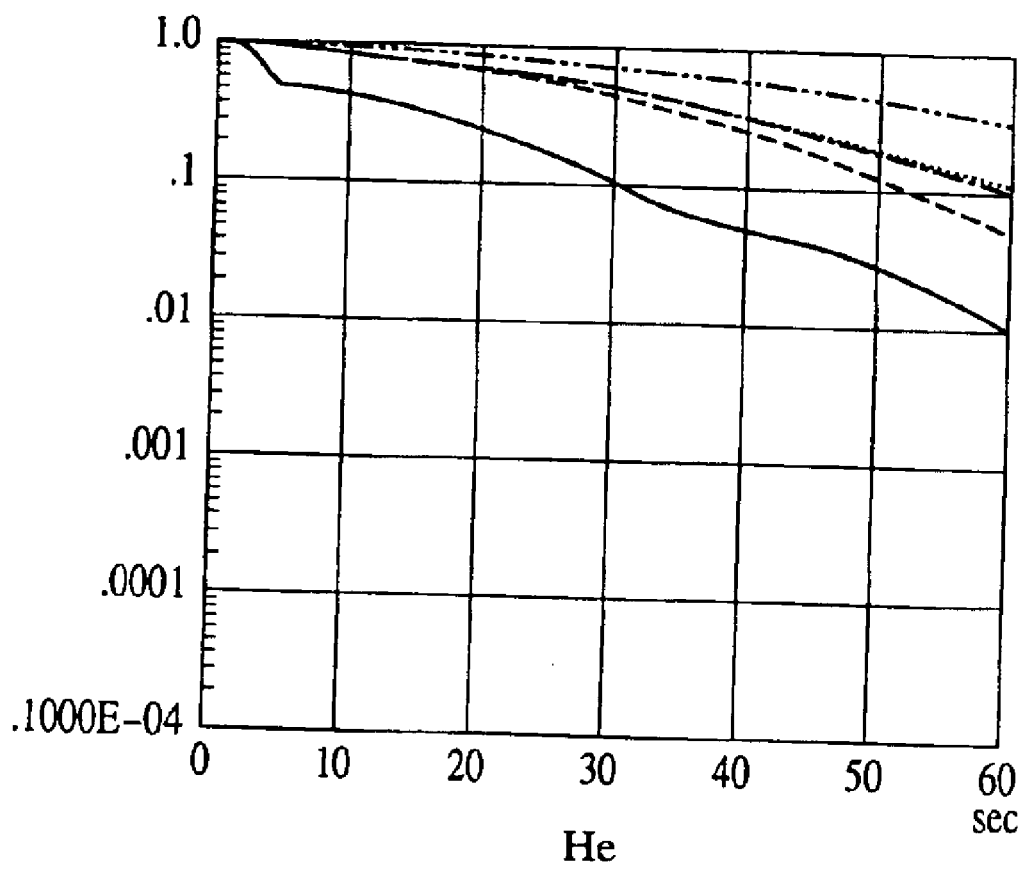
FIG. 20 is a graph showing a result of a simulation of the atmospheric concentrations in the other hermetically-sealed vessel at respective positions when gravity is taken into consideration.

FIG. 20 shows a graph indicating the change of concentration of air at respective positions in the vessel in this case. It can be found that disposing the gas supply port and the gas exhaust port as shown in FIG. 19 makes it difficult to displace the air in the vicinity of the lower right portion of the vessel.

As described above, when it is desired to replace the air at a portion of the vessel where the air is liable to stagnate with a gas only by diffusion of molecules, a very long time is required to reduce the concentration of the air originally existing in the vessel.

Especially, when the concentration of oxygen in a light path is high in that wavelength region of vacuum ultraviolet light, light is greatly absorbed by the oxygen because a zone where light is absorbed by oxygen continuously exists in that wavelength region. Accordingly, an oxygen concentration must be reduced to 1 ppm or less to normally operate an exposure apparatus. However, the replacement of air with helium executed by the conventional method takes a long time to achieve a desired oxygen concentration as described above. Further, a large amount of helium must be consumed, which is very uneconomical because helium exists in the earth's crust and in the air in only a very small amount, and thus, is very expensive.

Accordingly, embodiments realized in consideration of the behavior of helium gas will be described below.

Embodiment of Exposure Apparatus

Figure 1:
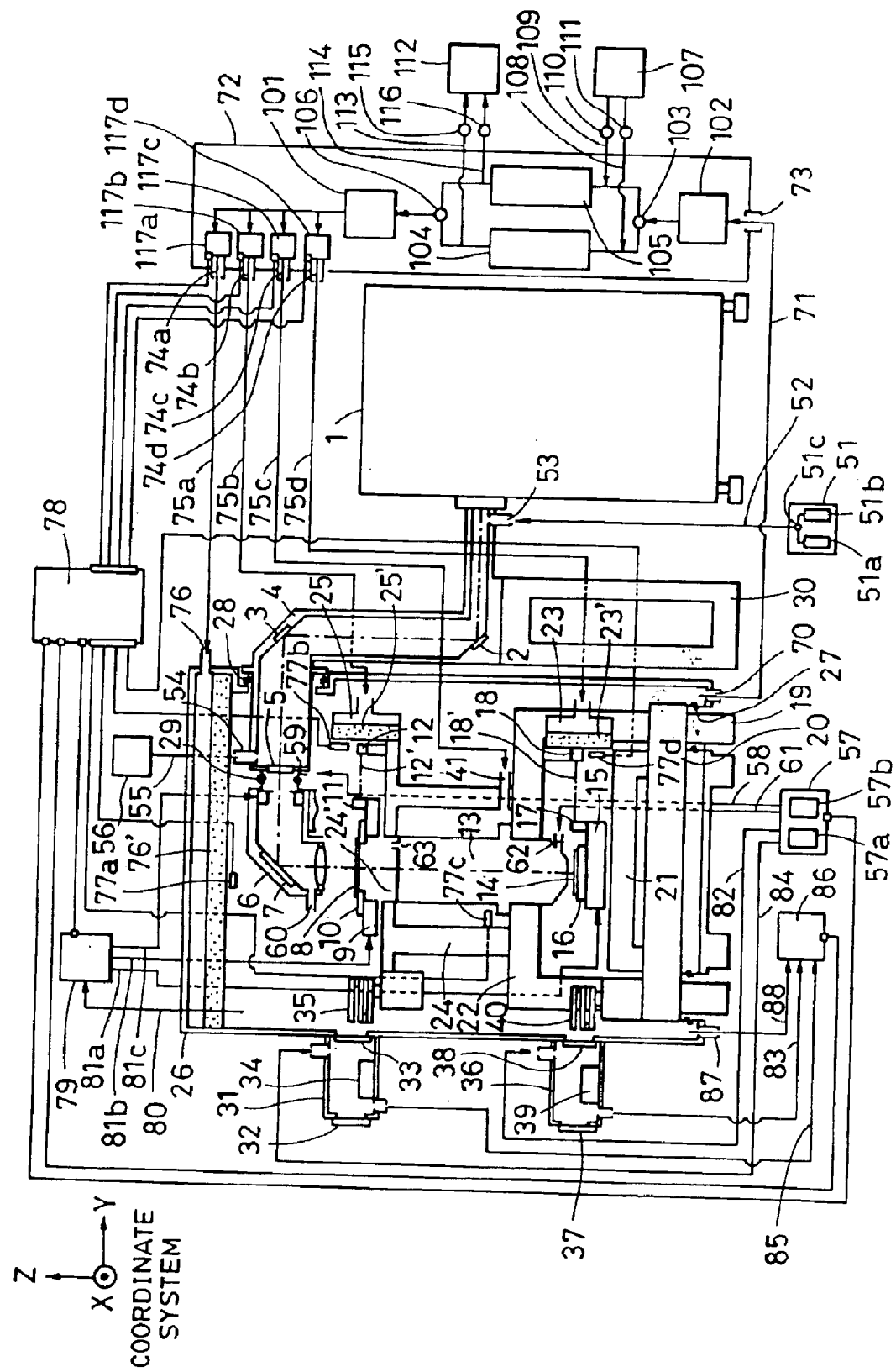
FIG. 1 is a view showing the overall construction of an exposure apparatus of an embodiment of the present invention.

FIG. 1 is a view showing the overall construction of an exposure apparatus of an embodiment of the present invention.

In FIG. 1, a laser unit 1 acting as a source of illumination of an exposure apparatus is disposed on a floor or in a downstairs room separately from the exposure apparatus. In this embodiment, the laser unit 1 is an excimer laser unit for creating vacuum ultraviolet light having a wavelength region of 160 nm or less. While an F2 excimer laser having an oscillation wavelength in the vicinity of 157 nm can be used in this embodiment, an illumination device that emits light having a wavelength in the ultraviolet ray region, such as an Ar2 laser and the like having an oscillating wavelength in the vicinity of 157 nm, may be used as well.

A laser beam emitted from the laser unit 1 is introduced into the main body of the apparatus through mirrors 2 and 3. A chamber 4 is hermetically sealed to shut off the vicinity of a light path including the mirrors 2 and 3, from the outside air. A glass element 5 is disposed at a portion of the chamber 4 through which the laser beam is emitted from the chamber 4. The glass element 5 permits the laser beam irradiated by the laser unit 1 to pass therethrough and introduces the laser beam into a cabinet 6, which will be described later. Further, the glass element 5 is held such that the chamber 4 is hermetically sealed. Note that the cabinet 6 is a kind of a chamber, because it surrounds a part of a space.

The glass element 5 is made of a glass material composed of a fluorine compound, and specifically, any of fluorite ($CaF_2$), magnesium fluoride ($MgF_2$), barium fluoride ($BaF_2$), $SrF_2$, and fluorine doped quartz may be used as the glass material. These glass materials exhibit a high transmissivity to light having a wavelength of 157 nm or less.

The interior of the chamber 4 will be described below in detail.

The light that passes through the glass element 5 falls incident on the cabinet 6 and illuminates a reticle 8 after reflecting off of a mirror 7 in the cabinet 6. The interior of the cabinet 6 will be also described below in detail.

The reticle 8 is placed on a reticle holder 10 placed on a reticle stage 9. The reticle stage 9 is driven by a reticle stage driving system (not shown) in a Y-direction as a scanning direction which is an in-plane direction perpendicular to an optical axis. A bar mirror 11 is fixed on the reticle stage 9, and an interferometer 12 measures a position of the bar mirror 11 to thereby measure a position of the reticle stage 9. FIG. 1 shows a state in which only one set of the interferometer 12 and bar mirror 11 is disposed and driven in the Y-direction as the scanning direction on a coordinate axis shown in the figure. However, another set of the interferometer 12 and a bar mirror 11 may be additionally disposed in an X-direction on the coordinate axes shown in the figure so as to measure a position of the reticle stage 9 on the X- and Y-axes.

A pattern (not shown) drawn on the reticle 8 is scaled down (reduced) by a projection optical system 13 at a predetermined reduction ratio and exposed and transferred onto a wafer 14 coated with a light sensitive agent. The interior of the projection optical system 13 also will be described below in detail.

The wafer 14 is placed on a wafer chuck 16 placed on a wafer stage 15. The wafer stage 15 is driven by a wafer stage driving system (not shown) in the X- and Y-directions, which are in-plane directions perpendicular to the optical axis. A bar mirror 17 is fixed on the wafer stage, and an interferometer 18 measures a position of the bar mirror 17 to thereby measure a position of the wafer stage. FIG. 1 shows a state in which only one set of the interferometer 18 and bar mirror 17 is disposed and driven in the Y-direction as the scanning direction on the coordinate axes shown in the figure. However, an interferometer 18 and a bar mirror 17 may be additionally disposed in the X-direction on the coordinates in the figure so as to measure a position of the reticle stage 9 on the X- and Y-axes because the wafer stage must move the wafer in the X-direction stepwise after scanning and exposure are finished.

Next, the structural member of the apparatus will be described.

A main surface plate 20 is placed on a plurality of legs 19. A stage surface plate 21 and a lens-barrel surface plate 22 are placed on the main surface plate 20.

The stage surface plate 21 includes a reference surface, which is parallel to an X-Y plane. The above-mentioned wafer stage 15 moves in the X- and Y-directions along the reference surface. In the embodiment shown, the wafer stage 15 is supported in a non-contact state with respect to the stage surface plate 21 by a guide using gas bearings. Note that the guide for supporting the wafer stage 15 also may use a rolling guide using balls or a sliding guide using rollers in place of the gas bearings.

An air conditioning duct 23 and an external cylinder 24 are placed on the lens-barrel surface plate 22 in addition to the above-mentioned projection optical system 13 and interferometer 18. The interferometer 18 is supported by the lens-barrel surface plate 22 by which the projection optical system 13 is supported, which permits a position of the wafer stage 15 to be measured with respect to the projection optical system 13. The air conditioning duct 23 blows gas supplied from a circulating system (which will be described later) in a direction perpendicular to the optical axis of the projection optical system 13 through an ULPA (ultra-low penetration air) filter 23' disposed in the air conditioning duct 23. The air conditioning duct 23 keeps a stable, predetermined temperature in the interferometer light path 18' of the interferometer 18 and the wafer 14 as well as in the space surrounded by the lens-barrel surface plate 22.

With this construction, wandering of the interferometer light path 18' can be reduced and deformation of materials caused by a temperature change in the space can be reduced. Further, the air conditioning duct 23 reduces the concentration of light absorbing substances (for example, oxygen) in an exposure light path from the end of the projection optical system 13 to the wafer 14.

Further, the above-mentioned reticle stage 9 moves in the Y-direction as the scanning direction (and sometimes also in the X-direction) along the reference plane formed on the external cylinder 24. In the embodiment, the reticle stage 9 is supported in a non-contact state with respect to the external cylinder 24 by a guide using gas bearings. Note that the guide for supporting the reticle stage 9 also may use a rolling guide using balls or a sliding guide using rollers in place of the gas bearings.

The external cylinder 24 surrounds the portion of the projection optical system 13 which is located above the upper surface of the lens-barrel surface plate 22 and includes an opening 24' at an upper portion thereof so that exposure light may pass therethrough. Further, the interferometer 12, an air conditioning duct 25 and the cabinet 6 (a portion where the cabinet 6 is joined to the external cylinder 24 is omitted by a broken line in FIG. 1) are placed on the external cylinder 24, in addition to the above-mentioned reticle stage 9. The interferometer 12 is supported by the external cylinder 24, which is constructed integrally with the projection optical system 13, so that the interferometer 12 can measure a position of the reticle stage 9 with respect to the projection optical system 13. The air conditioning duct 25 blows the gas supplied from a circulation system (which will be described later) in a direction perpendicular to the optical axis of the projection optical system 13 through a ULPA filter 25' disposed in the air conditioning duct 25. The air conditioning duct 25 keeps a stable, predetermined temperature in the interferometer light path 12' of the interferometer 12 and the reticle 8 as well as in the space in the vicinity of the reticle 8. With this construction, wandering of the interferometer light path 12' can be reduced and the deformation of materials caused by a temperature change in the space in the vicinity of the reticle 8 can be reduced. Further, the air conditioning duct 25 reduces the concentration of light absorbing substances (for example, oxygen) in a light path in front of and behind the reticle 8.

In the embodiment shown in FIG. 1, a chamber 26 accommodates the main body of the apparatus therein and is hermetically sealed for shutting off the interior thereof from the outside air. Movable members 27, composed of bellows of stainless steel or the like, connect the chamber 26 to portions in the vicinity of the legs 19, keep the chamber 26 hermetically sealed, and can absorb the relative displacement between the chamber 26 and the legs 19 and the main surface plate 20.

Movable members 28, composed of bellows of stainless steel or the like, connect the chamber 4 to the chamber 26, keep the chambers 4 and 26 hermetically sealed, and can absorb the relative displacement between the chamber 4 placed on a support table 30 and the chamber 26.

Further, movable members 29, composed of bellows of stainless steel or the like, connect the chamber 4 to the cabinet 6, keep the chamber 4 and the cabinet 6 hermetically sealed, and can absorb the relative displacement between the chamber 4 and the cabinet 6.

It should be noted that while bellows of stainless steel are used as the movable members 27, 28, and 29 in this embodiment, the movable members are not limited to stainless steel bellows and any bellows such as metal bellows of a nickel alloy, titanium or a resin may be used as long as they can keep the chambers 4 and 26 and the cabinet 6 hermetically sealed and absorb relative displacement. Further, a magnetic fluid seal also may be used, in addition to the bellows.

A load lock chamber 31 is used to insert and to extract the reticle 8 and includes gate valves 32 and 33 which can be opened and closed by a driving system (not shown). A support table 34 is used to support the reticle 8. A reticle transport robot 35 supplies and collects the reticle 8 to and from the reticle holder 10.

A load lock chamber 36 is used to insert and to extract the wafer 14 and includes gate valves 37 and 38 which can be opened and closed by a driving system (not shown). A support table 39 is used to support the wafer 14. A wafer transport robot 40 supplies and collects the wafer 14 to and from the wafer chuck 16.

Next, a method of controlling the environments and the temperatures in the chambers 4 and 26 and in the load lock chambers 31 and 36 will be described.

A gas supply source 51 includes nitrogen gas supply source 51a, a helium gas supply source 51b, and a switching valve 51c. These two types of gases exhibit an excellent transmissivity to an F2 laser beam. The nitrogen gas supply source 51a and the helium gas supply source 51b each supply gases which contain substantially no oxygen. It should be noted that the term "contain substantially no oxygen" means that the gases "do not contain oxygen in an amount which greatly affects the performance of the apparatus" and that they have "an oxygen concentration which is lower than the maximum oxygen concentration acceptable for the chamber 4 and the like".

The gas supply source 51 supplies either nitrogen gas or a helium gas by switching between the nitrogen gas supply source 51a and the helium gas supply source 51b by means of the switching valve 51c.

The gas supplied from the gas supply source 51 is introduced to a gas supply port 53 defined at an end of the chamber 4 on an illumination side through piping 52. From there the gas passes through the interior of the chamber 4 and is discharged from a gas discharge port 54 defined at the other end of the chamber 4 on an exposure apparatus side, where the gas is exhausted into an exhaust mechanism 56 through piping 55.

Next, a gas replacing method that is a feature of this embodiment will be described with reference to FIG. 2.

Figure 2:
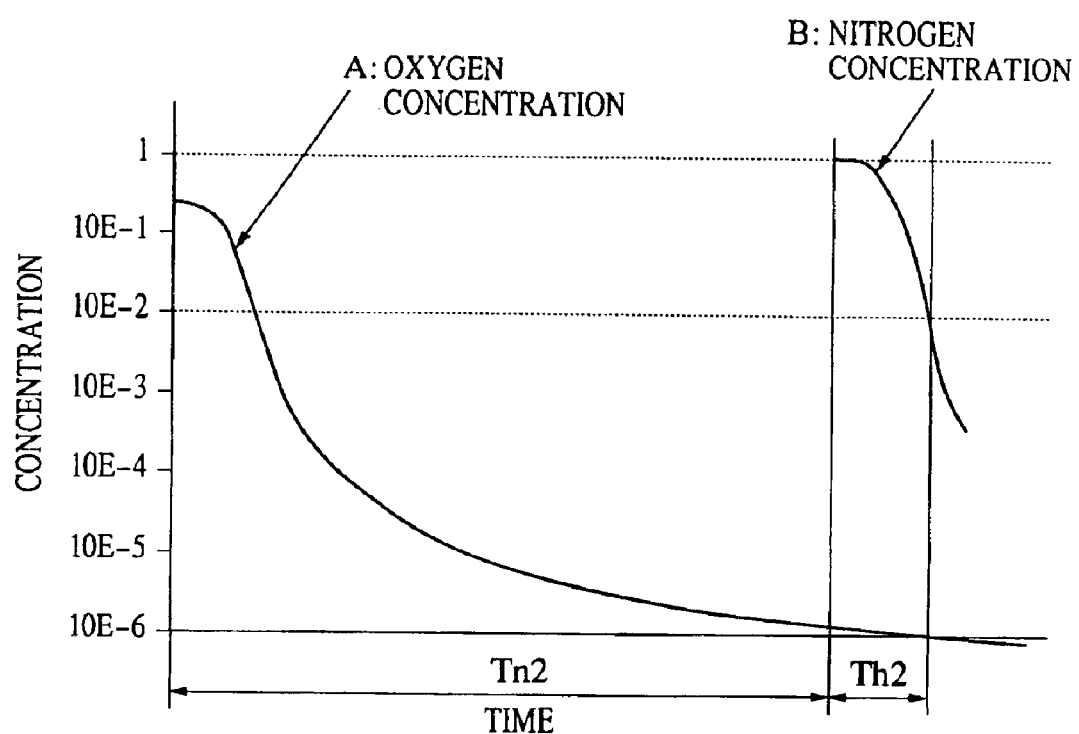
FIG. 2 is a graph showing how an oxygen concentration and nitrogen concentration change as time passes in a gas replacing method of the present invention.

FIG. 2 is a graph showing how an oxygen concentration and nitrogen concentration in gas exhausted from a gas exhaust port change as time passes when nitrogen and helium are supplied from the supply port of the chamber 4 stepwise.

In FIG. 2, the vertical axis shows a concentration (logarithmic scale) and the lateral axis shows time (real number scale), "A" shows an oxygen concentration, "B" shows nitrogen concentration, "Tn2" shows nitrogen supply time, and "Th2" shows a helium supply time.

A description will be made along the time axis of FIG. 2. First, nitrogen gas is supplied from the nitrogen gas supply source 51a by the switching valve 51c of the gas supply source 51. Thus, the oxygen concentration "A" is reduced through approximately the same progress as that explained with reference to FIG. 18A. After a time "Tn2" has passed, the oxygen concentration "A" reaches an order of ppm. At that time, the supply of the nitrogen gas is stopped by the swiching valve 51c and then helium gas is supplied from the helium gas supply source 51b by the switching valve 51c. Thus, the oxygen concentration "A" is continuously reduced and the nitrogen concentration "B" is reduced as well.

After a time "Th2" has passed, the nitrogen concentration "B" is reduced to a few percent. When the oxygen concentration "A" is reduced to about 1 ppm or less and the nitrogen concentration "B" is reduced to a few percent or less, no problem arises optically. Thus, at that time, the gas replacement by helium is finished. It should be noted that the term "replacement" does not mean to completely replace the gas in the chamber 4 with another gas but rather means to supply the other gas until the concentration of a gas originally existing in the chamber 4 is reduced to a desired concentration.

As described with reference to FIG. 2, while the time "Tn2", which is necessary to reduce the oxygen concentration to the order of ppm, is considerably long, the time "Th2", which is necessary to reduce the nitrogen concentration to a few percent, is very short compared to the time "Tn2". Further, the price of nitrogen is about 1/100th the price of helium, which permits the oxygen in the chamber 4 to be removed at a low cost.

Further, an increase in an amount of nitrogen supplied per unit time can reduce the time "Tn2", thereby reducing the time necessary to reduce the oxygen concentration in the chamber 4. Further, the oxygen in the chamber 4 can be removed at a low cost because an amount of helium, which is supplied after the oxygen in the chamber 4 has been substantially replaced with nitrogen, need not be increased.

Further, when nitrogen is supplied in a state which is different from a state in which helium is supplied, a time necessary to reduce stagnant oxygen can be decreased as compared with the conventional method. In particular, since nitrogen and helium have a different specific gravity, they stagnate in the chamber 4 differently. Accordingly, the supply of helium after the oxygen in the chamber 4 is replaced with nitrogen can increase the speed at which the oxygen in the chamber 4 is reduced.

Further, the specific gravity of nitrogen is approximately the same as that of air, whereas the specific gravity of helium is less than that of air. Therefore, the oxygen concentration in the chamber 4 can be more promptly reduced by replacing the air in the chamber 4 with nitrogen first rather than replacing the air with helium from the beginning of the replacement process.

It should be noted that when light in the vacuum ultraviolet region is used, it is necessary to reduce the oxygen concentration to a level of ppm, whereas the nitrogen concentration can be at a level of a few percent. Thus, the interior of the chamber 4 can be regulated to a preferable state for an optical system by replacing the air in the chamber 4 with nitrogen first, and supplying helium into the chamber 4 thereafter.

Further, the interior of the chamber 4 may be evacuated before or after the air in the chamber 4 is replaced with nitrogen and then helium may be supplied thereinto.

Figure 3:
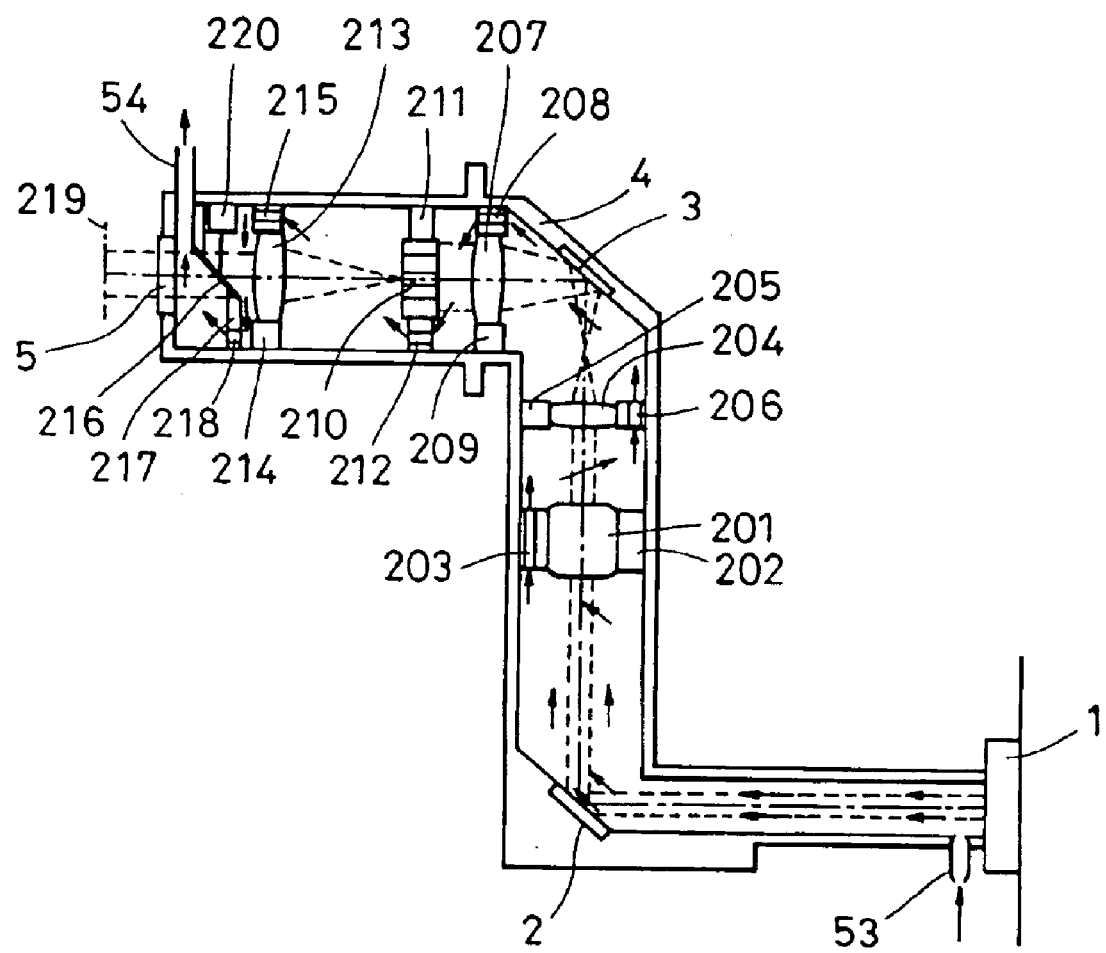
FIG. 3 is a view showing a part of the construction of the exposure apparatus shown in FIG. 1.

Next, a gas flow path through the chamber 4 will be described with reference to FIG. 3. In FIG. 3, the same components shown in FIG. 1 are denoted by the same reference numerals and the description thereof is omitted.

The laser beam emitted from the laser unit 1 is reflected by the mirror 2 and shaped to a predetermined beam shape by a beam shaping optical system 201. Thereafter, the laser beam irradiates an optical integrator 210 at a predetermined magnification through condensers 204 and 207. The optical integrator 210 is composed of minute lenses disposed two-dimensionally and irradiates a conjugate surface 219 with the reticle 8 (FIG. 1) in a superimposed manner through a condenser 213. A half mirror 216 is interposed between the condenser 213 and the conjugate surface 219 to partly reflect the laser beam to introduce it to an illuminance sensor 220. The illuminance sensor 220 is disposed on a surface which is substantially equivalent to the above-mentioned conjugate surface 219 and can detect the actual amount of exposure of the wafer 14 (FIG. 1) when it is exposed. An exposing operation is executed by a control system (not shown) which controls the oscillating state of the laser unit 1 based on a value detected by the illuminance sensor 220.

Note that the beam shaping optical system 201 is supported by a support table 202 having a ventilation port 203. The condenser 204 is supported by a support table 205 having a ventilation port 206. The condenser 207 is supported by a support table 209 having a ventilation port 208. The optical integrator 210 is supported by a support table 211 having a ventilation port 212. The condenser 213 is supported by a support table 214 having a ventilation port 215. The half mirror 216 is supported by a support table 217 having a ventilation port 218.

The gas supplied enters the chamber 4 through the gas supply port 53, flows through the chamber 4 along the light path, sequentially passes through the ventilation ports 203, 206, 208, 212, 215, and 218 and is exhausted from the gas discharge port 54.

The gas flow path in the chamber 4 is conceptually shown by arrows in FIG. 3.

The provision of the gas flow path which sequentially passes through the spaces between optical elements in the chamber 4 permits the air in those spaces to be effectively displaced by the gas.

Note that while a parallel plane of glass is used as the glass element 5 in this embodiment, the glass element 5 is not limited thereto and other light transmitting elements such as a lens, a prism, and the like may be used. Furthermore, while a flyeye is used as the optical integrator 210 in this embodiment, a rod integrator, a plurality of flyeyes disposed in series, or a combination of a flyeye and a rod integrator could be used as alternatives to the flyeye optical integrator.

Note that the optical system shown in FIG. 3 forms an illumination optical system for illuminating the reticle in combination with the optical system disposed in the cabinet 6, which will be described later.

While the same gas supply port, gas exhaust port and ventilation ports are used for nitrogen and helium in the above description, the embodiment is not limited thereto. For example, the gas supply port for nitrogen may be disposed at the end of the chamber 4 on the illumination side and the gas supply port for helium may be disposed at the end of the chamber 4 on the exposure apparatus side. Further, in view of the specific gravities of nitrogen and helium, the positions of the ventilation ports, which are important in the formation of the flow path through the chamber 4, may be differ between a time when nitrogen is supplied and a time when helium is supplied. This may be realized by providing operable/closable ventilation ports and selectively closing and opening them depending upon the type of gas being supplied.

Note that the above gas replacement method is not limited to the chamber 4 and may be widely utilized to replace a gas in any hermetically-sealed vessel. That is, the method may be utilized to supply a gas into the chamber 26, the load lock chambers 31 and 36, the external cylinder 24, the projection optical system 13, and the cabinet 6, which will be described later. In addition, a gas also may be supplied to the air conditioning ducts 23 and 25 and the like by the foregoing gas replacement method.

Further, the gas replacement method is not limited to the combination of nitrogen and helium and can obtain a similar effect when other gases having different specific gravities are sequentially supplied. For example, even if a gas lighter than air is supplied first and a gas heavier than air is supplied next, a gas originally existing in a hermetically-sealed vessel can be promptly replaced with the replacement gases. It should be noted that the gases to be supplied are preferably inactive gases, and, in particular, they are preferably helium and nitrogen such as described above.

Returning to FIG. 1, the exposure apparatus of this embodiment will be further described.

In FIG. 1, a gas supply source 57 includes nitrogen gas supply source 57a and a helium gas supply source 57b. These two types of gases exhibit an excellent transmissivity to an F2 laser beam.

The gas supply source 57 supplies either nitrogen gas or helium gas by switching between the nitrogen gas supply source 57a and the helium gas supply source 57b using a switching valve (not shown).

The gas supplied from the gas supply source 57 is introduced to a gas supply port 59 disposed in the cabinet 6 or to bellows 29 through piping 58. From there the gas passes through the interior of the cabinet 6 and then is discharged into the chamber 26 from a gas discharge port 60 defined at an end of the cabinet 6.

Figure 4:
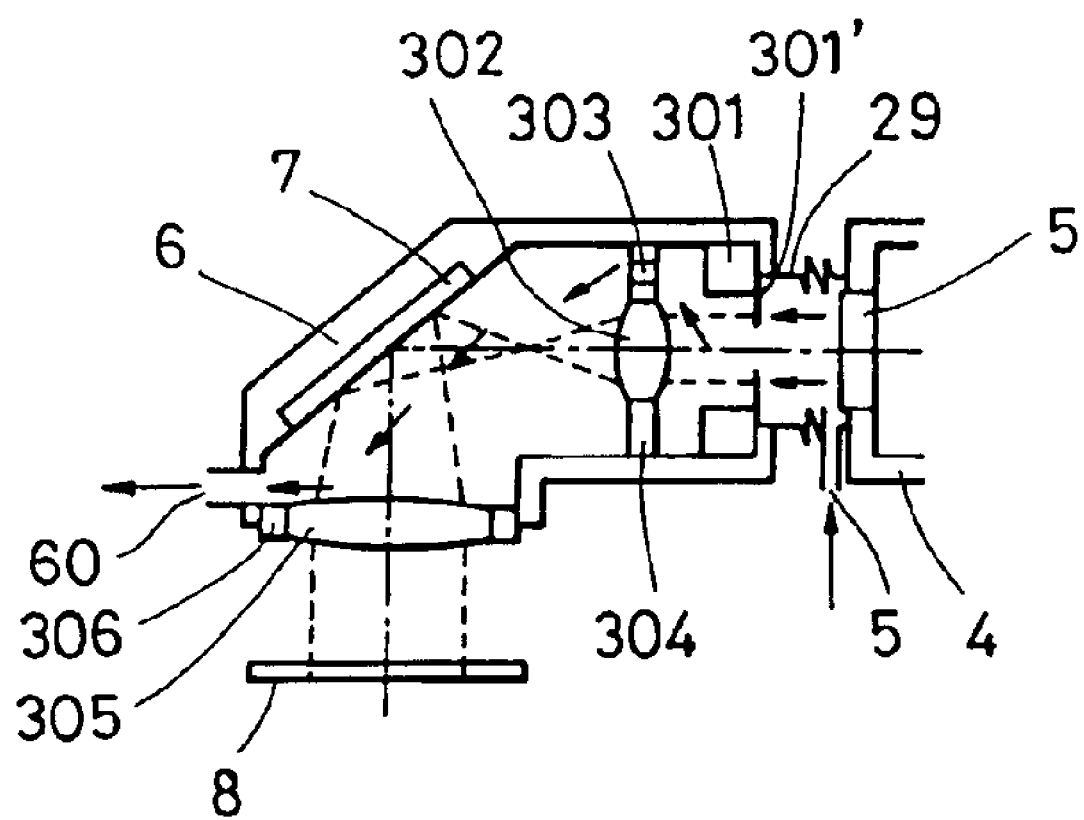
FIG. 4 is a view showing a part of the construction of the exposure apparatus shown in FIG. 1.

The gas flow path in the cabinet 6 will be described with reference to FIG. 4. In FIG. 4, the same components as shown in FIGS. 1 and 3 are denoted by the same reference numerals and the description thereof is omitted.

A masking blade 301 has a rectangular opening for defining the illumination range of the reticle 8. Further, the size of the rectangular opening can be changed in accordance with a reticle pattern and a position of the reticle 8 by driving the masking blade 301 using a driving unit (not shown). A light shielding plate 301' for forming the rectangular opening of the masking blade 301 is disposed in the vicinity of the conjugate surface 219 with the reticle 8 described above with reference to FIG. 3. Condensers 302 and 305 project the image of the rectangular opening formed by the masking blade 301 to the reticle 8 at a predetermined magnification. Therefore, the optical system shown in FIG. 4 constitutes a part of the illumination optical system for illuminating the reticle 8 together with the optical system described above with reference to FIG. 3.

Gases are supplied to the cabinet 6 by a method similar to the above-mentioned method for supplying the gases to the chamber 4. That is, first, nitrogen gas is supplied to the cabinet 6 by the nitrogen gas supply source 57a, and then helium gas is supplied thereto by the helium gas supply source 57b. The result is similar to that obtained for the chamber 4.

It should be noted that the light shielding blade 301' is constructed to move along a guide (not shown), and, in this embodiment, a gas bearing acts as a non-contact bearing. However, the embodiment is not limited thereto and a rolling guide using balls or a sliding guide using rollers could be used as alternatives.

The condenser 302 is supported by a support table 304 having a ventilation port 303, and the condenser 305 is supported by a support table 306.

Note that the gas supplied from the gas supply port 59 flows through the interior of the cabinet 6, flows along the light path between the condensers 302 and 305, and passes through the ventilation hole 303 in the support table 304, and is discharged from the gas discharge port 60. The gas flow path in the chamber 6 is conceptually shown by arrows in FIG. 4. The provision of the gas flow path which sequentially passes through the spaces between optical elements in the chamber 6 permits the air in those spaces to be effectively displaced by the gas.

Further, while the gas discharged from the gas discharge port 60 is discharged directly into the chamber 26 in this embodiment, the invention is not limited thereto. That is, the gas discharged from the gas discharge port 60 may be introduced to the optical systems disposed in the light path from the cabinet 6 to the wafer 14, for example, to the projection optical system 13 or the like, and may be discharged into the chamber 26 after it passes through the interior of projection optical system 13. Otherwise, the gas discharged from the gas discharge port 60 may be directly collected.

Note that while the optical system shown in FIG. 4 is an imaging optical system using a condenser system, a reflecting/refractive optical system or a reflecting optical system also could be used.

Further, while a case in which a rectangular shape is used as the opening shape of the masking blade 301 is described in this embodiment, the invention is not limited thereto and an arc-shaped opening having a predetermined radius of curvature could be used instead.

Furthermore, while the gas supply port 59 is disposed at the end of the cabinet 6 on the illumination side and the gas discharge port 60 is disposed at the end of the cabinet 6 on the reticle side in this embodiment, the invention is not limited thereto. For example, the gas supply port 59 may be disposed at an end of the cabinet 6 on the reticle side, and the gas discharge port 60 may be disposed at an end of the cabinet 6 on the illumination side. In particular, it may be preferable to arrange a portion of the cabinet 6, such as where the masking blade is located, to be a downstream side when the gas purity of the atmosphere in the cabinet 6 and the like are taken into consideration.

According to this embodiment, while the same gas supply port, gas exhaust port and ventilation ports are used for nitrogen and helium, the invention is not limited thereto similarly to the case of the above-mentioned chamber 4. Further, in view of the specific gravities of nitrogen and helium, the positions of the ventilation ports which are important in the formation of the flow path in the cabinet 6, may differ between a time when nitrogen is supplied and a time when helium is supplied. This may be realized by providing openable/closable ventilation ports and selectively closing and opening them depending upon the type of gas being supplied, similarly to the case of the above-mentioned chamber 4.

In FIG. 1, gas supplied from the gas supply source 57 is introduced to a gas supply port 62 defined at an end of the projection optical system 13 on the wafer side through piping 61. From there the gas passes through the interior of the projection optical system 13, and then is discharged into the chamber 26 from a gas discharge port 63 defined at the other end of the projection optical system 13 on the reticle side.

Figure 5:
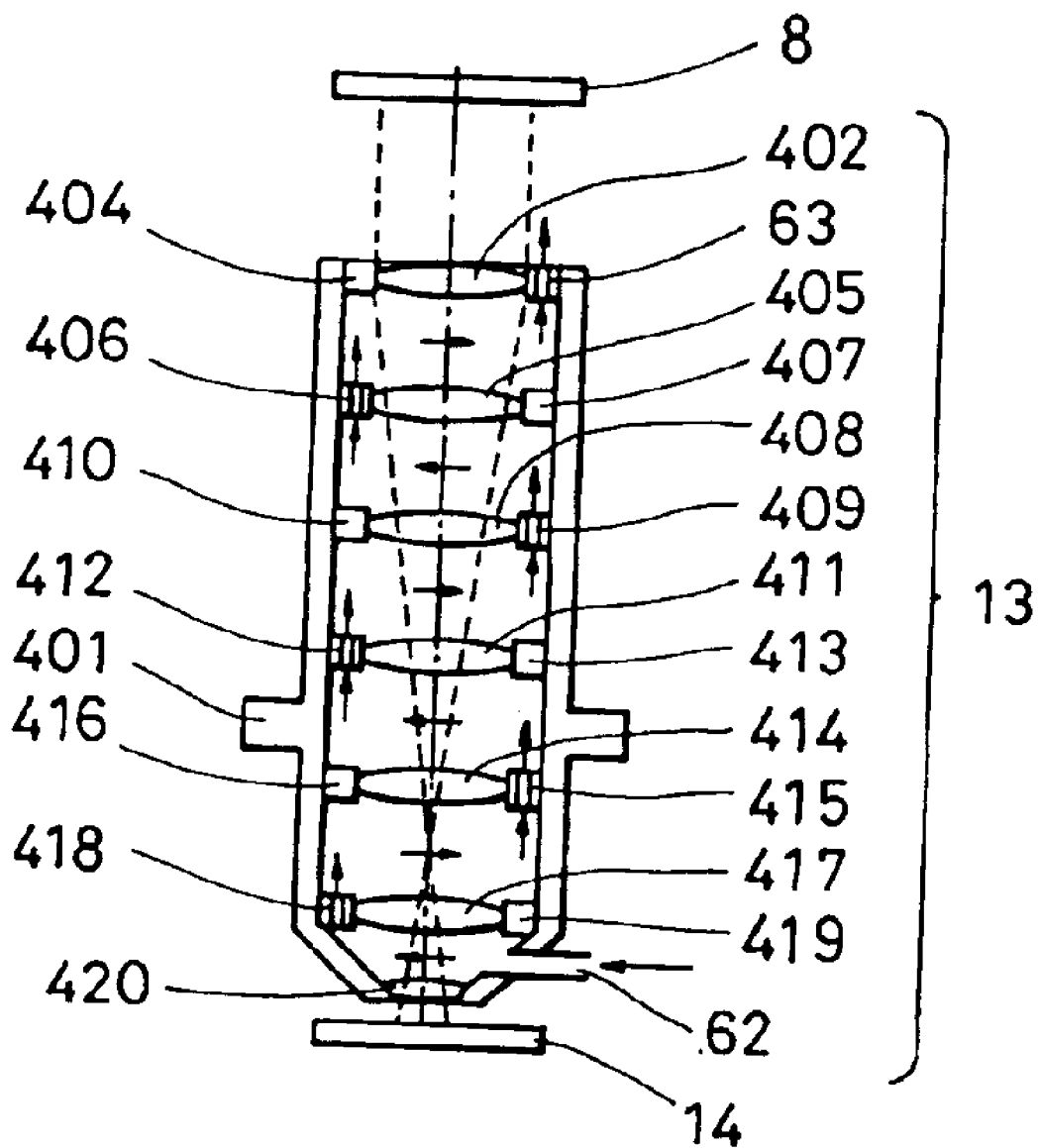
FIG. 5 is a view showing a part of the construction of the exposure apparatus shown in FIG. 1.

The gas flow path in the projection optical system 13 will be described with reference to FIG. 5. In FIG. 5, the same components shown in FIGS. 1 and 4 are denoted by the same reference numerals and the description thereof is omitted.

A pattern drawn on the reticle 8 is scaled down (reduced) and projected onto the wafer 14 by lenses 402, 405, 408, 411, 414, 417, and 420. Reference numeral 401 denotes the lens-barrel of the group of the above lenses.

The lens 402 is supported by a support table 404 having the gas discharge port 63. The lens 405 is supported by a support table 407 having a ventilation port 406. The lens 408 is supported by a support table 410 having a ventilation port 409. The lens 411 is supported by a support table 413 having a ventilation port 412. The lens 414 is supported by a support table 416 having a ventilation port 415. The lens 417 is supported by a support table 419 having a ventilation port 418. The lens 420 and the support tables 407, 410, 413, 416, and 419 are supported by the lens-barrel 401.

The gas supplied from the gas supply port 62 is discharged from the gas discharge port 63 after sequentially passing through the ventilation ports 418, 415, 412, 409, and 406, which are provided in the respective support tables. The gas flow path in the projection optical system 13 is conceptually shown by arrows in FIG. 4. The provision of the gas flow path which sequentially passes through the spaces between optical elements in the projection optical system 13 permits the air between the optical elements to be effectively displaced by the gas.

Gases are supplied into the projection optical system 13 by a method similar to the above-mentioned method of supplying gases into the chamber 4. That is, first, nitrogen gas is supplied into the projection optical system 13 from the nitrogen gas supply source 57a and then a helium gas is supplied thereinto from the helium gas supply source 57b. The result is similar to that obtained for the chamber 4.

Note that while in this embodiment the gas discharged from the gas discharge port 63 is discharged directly into the chamber 26, the invention is not limited thereto. That is, the gas discharged from the gas discharge port 63 may be introduced into the optical systems disposed in the light path from the glass element 5 (FIGS. 1 to 4) to the wafer 14, such as, for example, into the cabinet 6 (FIGS. 1 and 4), and may be discharged into the chamber 26 after it passes through the interior of the cabinet 6. Further, the gas discharged from the gas discharge port 63 may be directly collected.

Furthermore, although a refractive optical system is used as the projection optical system 13 in this embodiment, a reflective/refractive optical system or a reflecting optical system also could be used.

According to this embodiment, while the same gas supply port, gas exhaust port and ventilation ports are used for nitrogen and helium, the invention is not limited thereto, similarly to the case of the above-mentioned chamber 4. In particular, when gas in the projection optical system 13 with a vertical optical axis is replaced, it is preferable to dispose a gas supply port on an upper and lower portion of the projection optical system 13 and to dispose a gas discharge port on an upper and lower portion thereof, in consideration of the different specific gravities of nitrogen and helium. In this case, nitrogen may be supplied from the gas supply port disposed at a lower portion of the projection optical system 13 and helium may be supplied from the gas supply port disposed at the upper portion thereof. Further, in view of the specific gravities of nitrogen and helium, the positions of the ventilation ports, which are important in the formation of the flow path in the projection optical system 13, may differ between a time when nitrogen is supplied and a time when helium is supplied. This may be realized by providing openable/closable ventilation ports and selectively closing and opening them depending upon the type of gas being supplied, similarly to the case of the above-mentioned chamber 4.

The gas discharged into the chamber 26 from the gas discharge ports 60 and 63 is discharged from the circulation output 70 of the chamber 26 and introduced into the introduction port 73 of a gas circulation system 72 through piping 71. The gas is divided into predetermined amounts of flow in the gas circulation system 72 and is discharged from distribution ports 74a, 74b, 74c, and 74d of the gas circulation system 72, respectively.

The gas discharged from the distribution port 74a is introduced into a down-flow duct 76 through piping 75a and blown into the chamber 26 through the ULPA filter 76' in the down-flow duct 76, which causes the gas in almost the entire chamber 26 to flow downward.

The gas discharged from the distribution port 74b is introduced into a partial duct 25 through piping 75b and is blown into a space in the vicinity of the reticle 8 and the interferometer light path 12'.

The gas discharged from the distribution port 74c is introduced into the gas introduction port 41 of the external cylinder 24. From there the gas passes through the space between the projection optical system 13 and the external cylinder 24, after which it is discharged into the chamber 26 from the opening 24' of the external cylinder 24.

The gas discharged from the distribution port 74b is introduced into a partial duct 23 through piping 75d and is blown into a space in the vicinity of the wafer 14 and the interferometer light path 18'.

Next, the interior of the gas circulation system 72 will be described.

The gas supplied from the introduction port 73 is circulated by a fan 102. A direction switching valve 103 sends the gas to either a first or second cleaner 104 or 105 which are disposed in parallel with each other. The direction switching valve 103 shuts off the flow of gas into the other of the first and second cleaners 104 and 105. A direction switching valve 106 opens the flow path of the first or second cleaner 104 or 105 to which the gas is sent and shuts off the flow path of the cleaner. Accordingly, the direction switching valves 103 and 106 are operated by a driving system (not shown) to open the flow path of the one cleaner and to shut off the flow path of the other cleaner.

A gas supply source 107 supplies an inactive gas, which, in this embodiment, is helium gas or nitrogen gas.

The gas supplied from the gas supply source 107 is supplied to the first and second cleaner 104 and 105 through piping 108 and 109, respectively. A driving system (not shown) drives an open/close valve 110 to turn on and off the supply of gas to the first cleaner 104. Similarly, a driving system (not shown) drives an open/close valve 111 to turn on and off the supply of gas to the second cleaner 105. Further, a gas discharge mechanism 112 discharges gas supplied from the first cleaner 104 through piping 113 and gas supplied from the second cleaner 105 through piping 114. The flow of gas from the first cleaner 104 to the gas discharge mechanism 112 is turned on and off by an open/close valve 115 and the flow of gas from the second cleaner 105 to the gas discharge mechanism 112 is turned on and off by an open/close valve 116. The open/close valves 115 and 116 are controlled by a driving system (not shown).

The details of the first and second cleaners 104 and 105 will be described with reference to FIG. 6.

Figure 6:
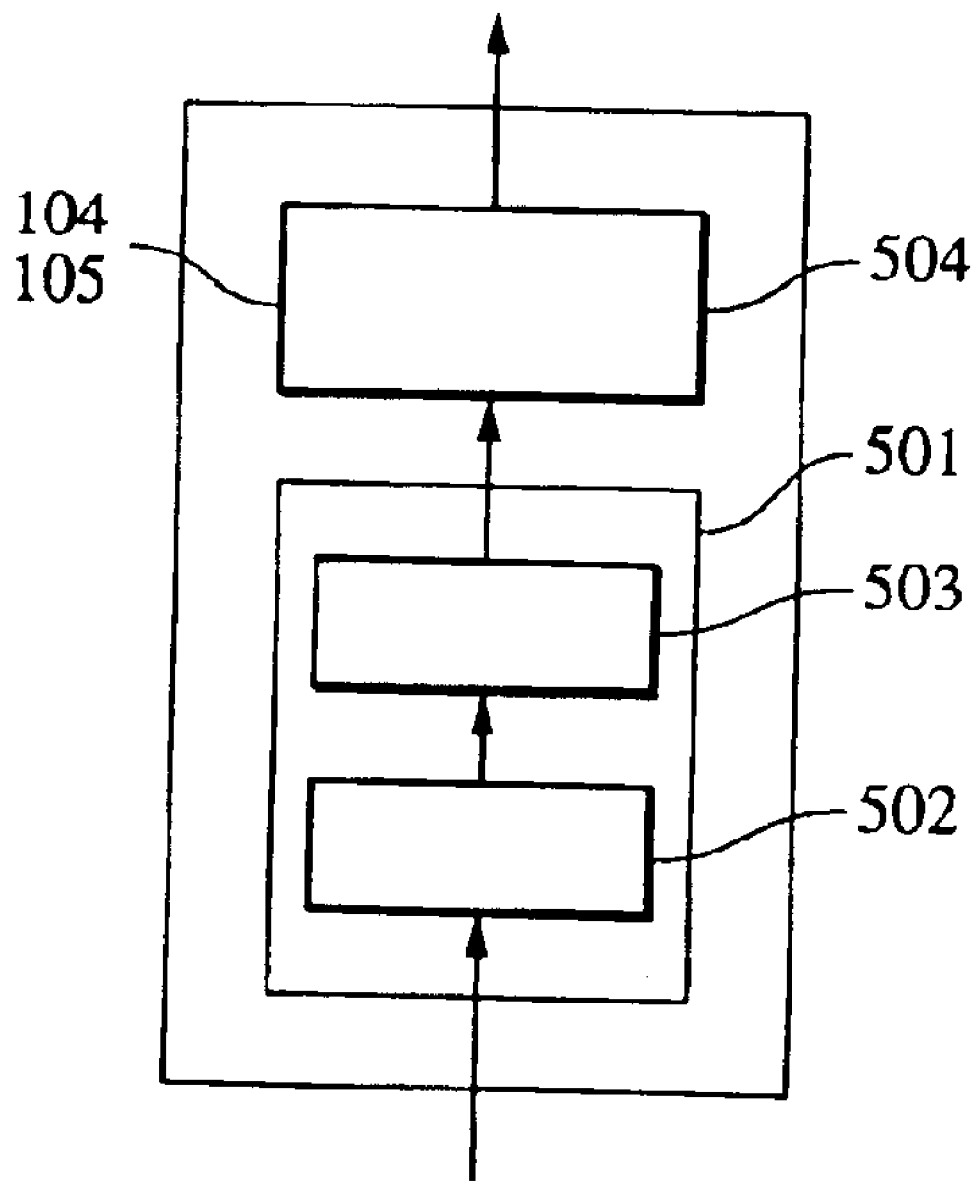
FIG. 6 is a view showing a part of the construction of the exposure apparatus shown in FIG. 1.

In FIG. 6, the same components shown in FIG. 1 are denoted by the same reference numerals and the description thereof is omitted.

Each of the first and second cleaners 104 and 105 includes an ozone/oxygen removing mechanism 501 and a chemical filter 504 for removing predetermined substances from a purge gas.

The ozone/oxygen removing mechanism 501 includes an ozone conversion mechanism 502 and an oxygen removing mechanism 503, which acts as internal mechanisms for removing ozone and oxygen, respectively, from gas supplied from an introduction port.

The ozone conversion mechanism 502 removes ozone by converting ozone ($O_3$) into oxygen ($O_2$) by a principle of conversion employing a chemical reaction utilizing, for example, activated carbon.

The oxygen, having been converted from ozone and passed through the ozone conversion mechanism 502, is removed by the oxygen removing mechanism 503. The oxygen removing mechanism 503 adsorbs and removes the oxygen in the gas by causing the gas to come into contact with iron powder, CaO, a Cu mesh or the like so that the oxygen is consumed in a chemical reaction (oxidation). Further, a commercially available high purity gas refiner may be used.

Since the air in the chamber 26 is replaced with helium gas or nitrogen gas, the oxygen and ozone concentrations in the chamber 26 are at a very low levels. However, a very minute amount (for example, on the order of ppm or less) of ozone and/or oxygen which still remains in the chamber 26 can be removed by the ozone/oxygen removing mechanism 501.

The chemical filter 504 removes impurities from the purge gas, specifically, ammonia ($NH_3$) and organic gases.

While an ion exchange type filter and an activated carbon type filter are commonly used chemical filters for this purpose, a ceramic porous body type filter is used in this embodiment.

The ceramic porous body type chemical filter can maintain a high impurities removing capability even in an environment with very low humidity (for example, on the order of ppm or less) and, thus, the ceramic porous body type filter is more preferable from a cleaning viewpoint.

However, when the ceramic porous member type chemical filter is exposed to a high humidity environment, such as air, for example, the filter absorbs water ($H_2O$). If the apparatus is operated in this state, there is a possibility that a gas containing water will be supplied to the chamber 26. This problem can be solved by the following method.

Figure 7A:
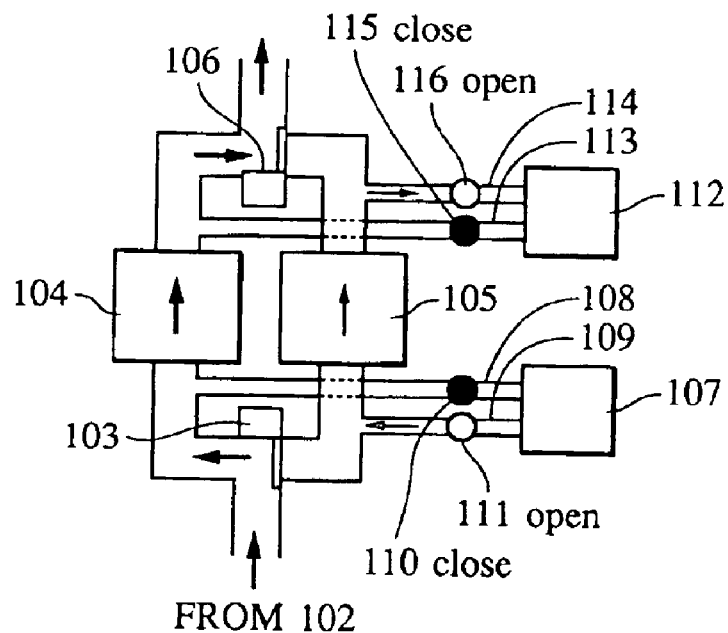
FIGS. 7A and 7B are views showing a part of the construction of the exposure apparatus shown in FIG. 1.
Figure 7B:
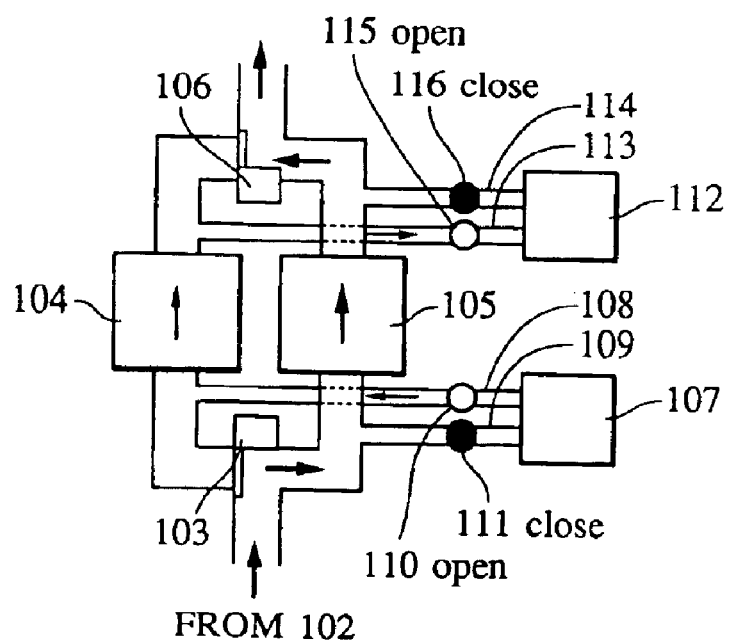

FIGS. 7A and 7B demonstrate the flow of gas for various settings of the direction switching valves 103 and 106 and the open/close valves 110, 109, 115, and 116.

FIG. 7A shows a state in which a gas supplied from the fan 102 passes through the first cleaner 104. Note that, in FIGS. 7A and 7B, the same components as shown in FIG. 1 are denoted by the same reference numerals.

In the state shown in FIG. 7A, the switching valves 103 and 106 close the second cleaner 105. The open/close valves 110 and 115 are also closed. Gas flow to the first cleaner 104 is shown by a thick arrow.

With both the front and back sides of the second cleaner 105 closed, the open/close valves 111 and 116 can also be closed (not shown) to permit, for example, replacement and/or maintenance of the second cleaner 105. Further, as shown in FIGS. 7A and 7B, when the open/close valves 111 and 116 are opened, gas is supplied from the gas supply source 107, after which the gas passes through the second cleaner 105 and is collected by the gas discharge mechanism 112. Gas flow in this case is shown by a thin arrow.

When gas is being supplied to the second cleaner 105 from the gas supply source 107, even if the second cleaner 105 comes into contact with air during a replacement job and absorbs substances which absorb exposing light, such as oxygen, water, or the like, the amount of the substances absorbed by the second cleaner 105 can be reduced by the gas being supplied to the second cleaner 105 from the gas supply source 107. Further, gas can be supplied to the first cleaner 104 even if the second cleaner 105 is undergoing a replacement or maintenance job, which permits these jobs to be carried out without interrupting the operation of the apparatus.

Further, since the ceramic porous body type ceramic filter 504 acts as a water removing filter in an ordinary operation, it is possible to restore the cleaning capability of a cleaner which is not used (the second cleaner 105 in FIG. 7A) by switching the cleaners when the apparatus is operated, for example, for a predetermined period of time. A degree of restoration of a cleaner's cleaning capability may be managed by controlling the period of time during which gas is supplied from the gas supply source 107. The degree of restoration of a cleaner's cleaning capability may be determined based on a gas detected by a gas detector (not shown) disposed just behind each cleaner.

FIG. 7B shows a state in which gas supplied from the fan 102 passes through the second cleaner 105. The methods of supplying gas from the fan 102 and the gas supply source 107, replacing and maintaining the first cleaner 104, and the like, are simply inverse to those described above with respect to FIG. 7A, and thus are not described here.

It should be noted that while a case in which two cleaners are provided is described in this embodiment, the invention is not limited thereto and three or more cleaners may be provided.

Further, while it is preferable that the gases supplied by the gas supply source 107 be the same as those supplied by the gas supply sources 51 and 57 shown in FIG. 1, different types of helium gas and nitrogen gas can be used as long as they do not substantially affect the capability of the apparatus. In particular, much like the gas supply sources 51 and 57 supply helium gas and nitrogen gas by switching between them, the gas supply source 107 also may supply helium gas and nitrogen gas by switching between them. Note that a single gas supply source may act as gas supply sources 51, 57 and 107.

Further, a mechanism for separating the gases collected from the introduction port into helium gas and nitrogen gas may be disposed within the gas circulation system 72 since the gas supply sources 51 and 57 use helium gas and nitrogen gas by switching between them.

Referring again to FIG. 1, the gas passing through the direction switching valve 106 is cooled to a predetermined temperature by a cooler 101 and is distributed to heaters 117a, 117b, 117c, and 117d at predetermined flow rates.

The heater 117a is set at a predetermined temperature in response to a command from a controller 78 based on a result detected by a thermometer 77a that detects the temperature of the gas supplied from the down-flow duct 76.

The heater 117b is set at a predetermined temperature in response to a command from the controller 78 based on a result detected by a thermometer 77b that detects the temperature of the gas supplied from the partial duct 25.

The heater 117c is set at a predetermined temperature in response to a command from the controller 78 based on a result detected by a thermometer 77c that detects the temperature of the gas within the external cylinder 24.

The heater 117d is set at a predetermined temperature in response to a command from the controller 78 based on a result detected by a thermometer 77d that detects the temperature of the gas supplied from the partial duct 23.

Gases are supplied to the respective ducts by a method similar to the method for supplying the gas into the above-mentioned chamber 4. That is, first, nitrogen gas is supplied to the respective ducts, after which helium gas is supplied thereto. The result is similar to that obtained for the chamber 4.

Note that the temperatures of the gases supplied from the gas supply source 57 may be previously set at predetermined temperatures. Alternatively, the paths of piping 58 and 61 may be regulated so that the gases reach the predetermined temperatures by the time they have reached the gas supply ports 59 and 62.

In FIG. 1, a high pressure gas supply unit 79 collects a portion of the gas in the chamber 26 through piping 80 and increases the pressure of the collected gas to a predetermined gas pressure. Thereafter, the high pressure gas supply unit 79 supplies the gas to the gas bearing (not shown) of the wafer stage 15 through piping 81a, to the gas bearing (not shown) of the reticle stage 9 through piping 81b, and to the gas bearing (not shown) of the masking blade 301 (FIG. 4) through piping 81c. Using an inactive gas, such as the purge gas in the chamber 26, as the actuating fluid for the gas bearings helps to maintain the environment in the chamber 26 in a predetermined state.

Figure 8:
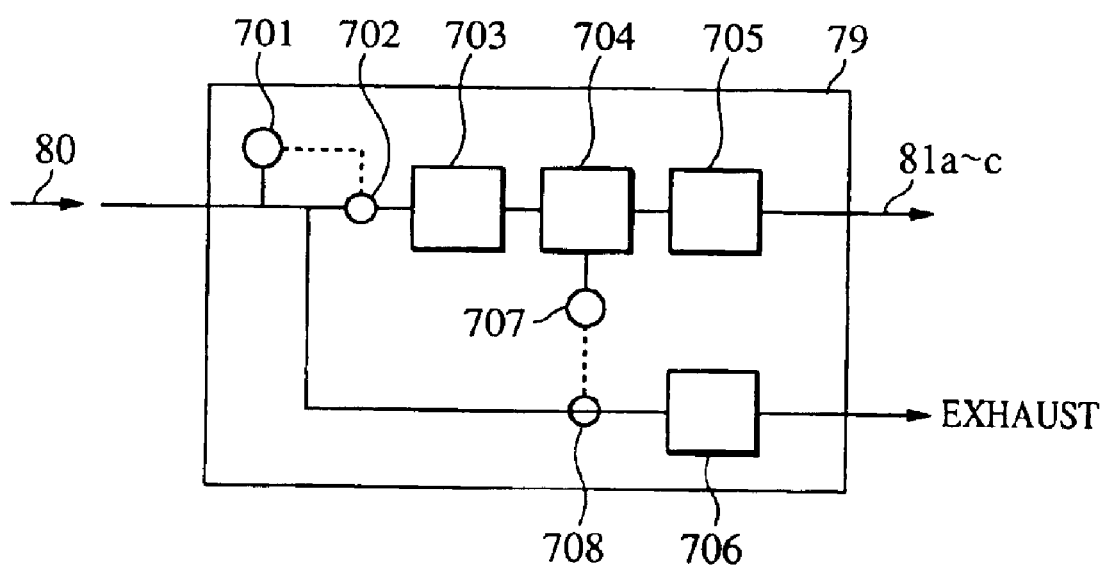
FIG. 8 is a view showing a part of the construction of the exposure apparatus shown in FIG. 1.

Next, the internal construction of the high pressure gas supply unit 79 will be schematically described with reference to FIG. 8.

The pressure of the gas supplied from piping 80 is detecting by a pressure gauge 701 and the flow rate of the gas is adjusted to a predetermined value using a control valve 702 that is controlled by the controller 78. The gas then passes through a collection pump 703, after which it is temporarily stored in a buffer tank 704, before being compressed to a predetermined pressure by a compressor 705 and supplied to pipings 81a to 81c. Further, an auxiliary line, by which the gas can be exhausted by an exhaust pump 706, branches off at a point between the pressure gauge 701 and the control valve 702. When it is necessary to exhaust the gas, an amount of gas to be exhausted is controlled by a mass flow controller 708 in response to a result detected by a pressure gauge 707 of the buffer tank 704. Note that the mass flow controller 708 is controlled by the controller 78 (FIG. 1) in response to a result detected by the pressure gauge 707.

According to the above construction, the pressure in the chamber 26 can be maintained at a desired pressure at all times. With this construction, optical characteristics which are sensitive to pressure variations, for example, the performance of the projection optical system 13 (FIG. 1), can be maintained.

It is also possible to maintain the relative pressure difference between the pressure inside the chamber 26 and a pressure outside the chamber 26 at a predetermined value. This can be achieved by detecting the pressure difference between the pressure in the piping 80 (that is, the pressure in the chamber 26) and the outside pressure by using the pressure gauge 701 as a differential pressure gauge.

Further, it is also possible to maintain the relative pressure difference between the pressures in the chambers 26 and 4 at a predetermined value. This can be achieved by detecting the relative pressure difference between the pressure in the piping 80 (that is, the pressure in the chamber 26) and the pressure in the chamber 4 by using the above-mentioned differential pressure gauge.

In FIG. 1, gas for replacing the air in the wafer load lock chamber 36 from the gas supply source 57 is supplied to the load lock chamber 36 through piping 82 and is exhausted to an exhaust mechanism 86 through piping 83. Similarly, gas for replacing the air in the reticle load lock chamber 31 from the gas supply source 57 is supplied to the load lock chamber 31 through piping 84 and is exhausted to the exhaust mechanism 86 through piping 85.

It should be noted that a timing at which the gas is supplied is such that after the gate valves 32 and 37 are opened and a reticle and a wafer are placed on the support tables 34 and 39, respectively, the gate valves 32 and 37 are closed, and a valve (not shown) of the gas supply source 57 and a valve (not shown) of the exhaust mechanism 86 are then opened in response to a command from the controller 78.

When the interiors of the load lock chambers 31 and 36 reach a predetermined state, the flow of gas is stopped by closing the valves in response to a command from the controller 78. Further, the gate valves 33 and 38 are opened, and the reticle 8 and the wafer 14 are placed in the apparatus by the transport robots 35 and 40.

When the reticle 8 or the wafer 14 is removed from the apparatus, gas is supplied while the gate valves 32, 33, 37, and 38 remain closed, and the supply of gas is stopped when the interiors of the respective load lock chambers reach a predetermined state. Next, the gate valves 33 and 38 are opened, and the reticle 8 and the wafer 14 are removed from the apparatus by the transport robots 35 and 40 and placed on the support tables 34 and 39 in the load lock chambers 31 and 39. After they are placed thereon, the gate valves 33 and 38 are closed, the gate valves 32 and 37 are opened, and the reticle 8 and the wafer 14 are removed by a taking-out unit (not shown).

While the reticle 8 and the wafer 14 are inserted and removed at the same time in the above description, they of course may be inserted and removed at different times.

One reason why the load lock chambers 31 and 36 are subjected to gas replacement is to prevent contamination of the environment in the chamber 26 when the gate valves 33 and 38 are opened.

Gases are supplied to the load lock chambers 31 and 36 by a method similar to the above-mentioned method for supplying gases to chamber 4. That is, first, nitrogen gas is supplied to the load lock chambers 31 and 36 by the nitrogen gas supply source 57a, after which helium gas is supplied thereto by the helium gas supply source 57*b*. The result is similar to that obtained for the chamber 4. According to this embodiment, while the same gas supply port is used to supply nitrogen and helium to the load lock chambers 31 and 36, the embodiment is not limited thereto, similarly to the case of the above-mentioned chamber 4. That is, a gas supply port and a gas exhaust port may be provided separately to take advantage of the different specific gravities of nitrogen and helium and the different convective movements of them in the load lock chambers.

Further, when a pellicle (not shown) is used to prevent the deposition of dust on the pattern surface of the reticle 8, it is preferable that the air in the space surrounded by the reticle 8, the pellicle, and a pellicle frame (not shown) be replaced with a purge gas. In that case, a pellicle frame having pressure equalizing holes (ventilation holes for communicating the inside of the pellicle frame with the outside thereof) is preferably used.

A gas exhaust port 87 is used to discharge gas from the chamber 26.

When the operation of the apparatus is started, the interiors of the chamber 26 and the gas circulation system 72 are filled with the air.

Therefore, when the apparatus is started up, gas from the gas supply source 57 is supplied into the projection optical system 13 and the cabinet 6. Meanwhile, gas is exhausted from the gas exhaust port 87 to the exhaust mechanism 86 through piping 88. The exhaust operation is turned on and off with a valve (not shown) disposed in the exhaust mechanism 86 that is controlled by the controller 78.

When the interior of the chamber 26 and the circulation system reach a predetermined state of gas replacement, the discharge of gas from the gas exhaust port 87 is stopped, and the apparatus is ready for an exposing operation.

A timing at which the gas exhausted from the gas exhaust port 87 is stopped may be determined in response to an exhaust stop command issued by the controller 78, which automatically determines whether or not a predetermined period of time has elapsed since the start of the exhaust process. Alternately, a gas detector (not shown) may be disposed at a predetermined position in the chamber 26 or in the circulation system thereof and the controller 78 may issue an exhaust stop command by automatically determining the timing based on a result detected by the gas detector.

Further, when it is desired to replace the air in the chambers 4 and 26 to a predetermined state in a shorter period of time at the start of operation of the apparatus, or when it is desired to improve throughput by completing the gas replacement of the load lock chambers 31 and 36 in a shorter period of time since they are repeatedly opened to the air and put in a gas replaced state each time a reticle and a wafer are replaced, the air may be forcibly discharged from the exhaust mechanisms 56 and 86 using a vacuum pump. Then, a gas purge may be carried out after the interiors of the chambers 4 and 26 and the interiors of the load lock chambers 31 and 36 have been evacuated. In that case, the chambers 4 and 26 and the load lock chambers 31 and 36 must have sufficient rigidity so that the performance of the apparatus is not affected. Otherwise, deformation of the chambers would result when they are evacuated.

In the embodiment of FIG. 1, even if the chambers 4 and 26 are deformed when they are evacuated, the direct transmission of the deformation to adjacent components is prevented by the employment of the movable members 27, 28, and 29.

Note that a series of the above operations for supplying the gas after evacuating the interiors of the chambers and the interiors of the load lock chambers may be repeated a plurality of times if necessary. When evacuation is repeated a plurality of times, even if the ultimate vacuum in the chambers and the load lock chambers is relatively low (an absolute pressure is high) as compared with a case in which the evacuation is carried out only once, the relatively low ultimate vacuum is acceptable, which can greatly reduce the cost of the vacuum pump and accessories necessary for evacuation. In the gas replacement method of the present invention, it is preferable to introduce helium after final evacuation is completed and to use nitrogen in the purge carried out before the final evacuation.

Further, according to the embodiment shown in FIG. 1, even if the interior of the chamber 4 is opened to the air during maintenance thereof, the chamber 26 can be kept in a purged state. Conversely, even if the interior of the chamber 26 is opened to the air, the chamber 4 can be kept in a purged state.

Embodiments of Semiconductor Manufacturing System

Next, embodiments of a manufacturing system for manufacturing a semiconductor device (e.g., a semiconductor chip such as an IC, LSI, or the like, a liquid crystal panel, a CCD, a thin film magnetic head, a micromachine, or the like) will be explained. In the manufacturing system of this embodiment, the repair of manufacturing apparatuses installed in a semiconductor manufacturing factory, as well as the periodic maintenance of the manufacturing apparatuses and software installation and maintenance services and the like are executed outside of the factory through a computer network.

Figure 9:
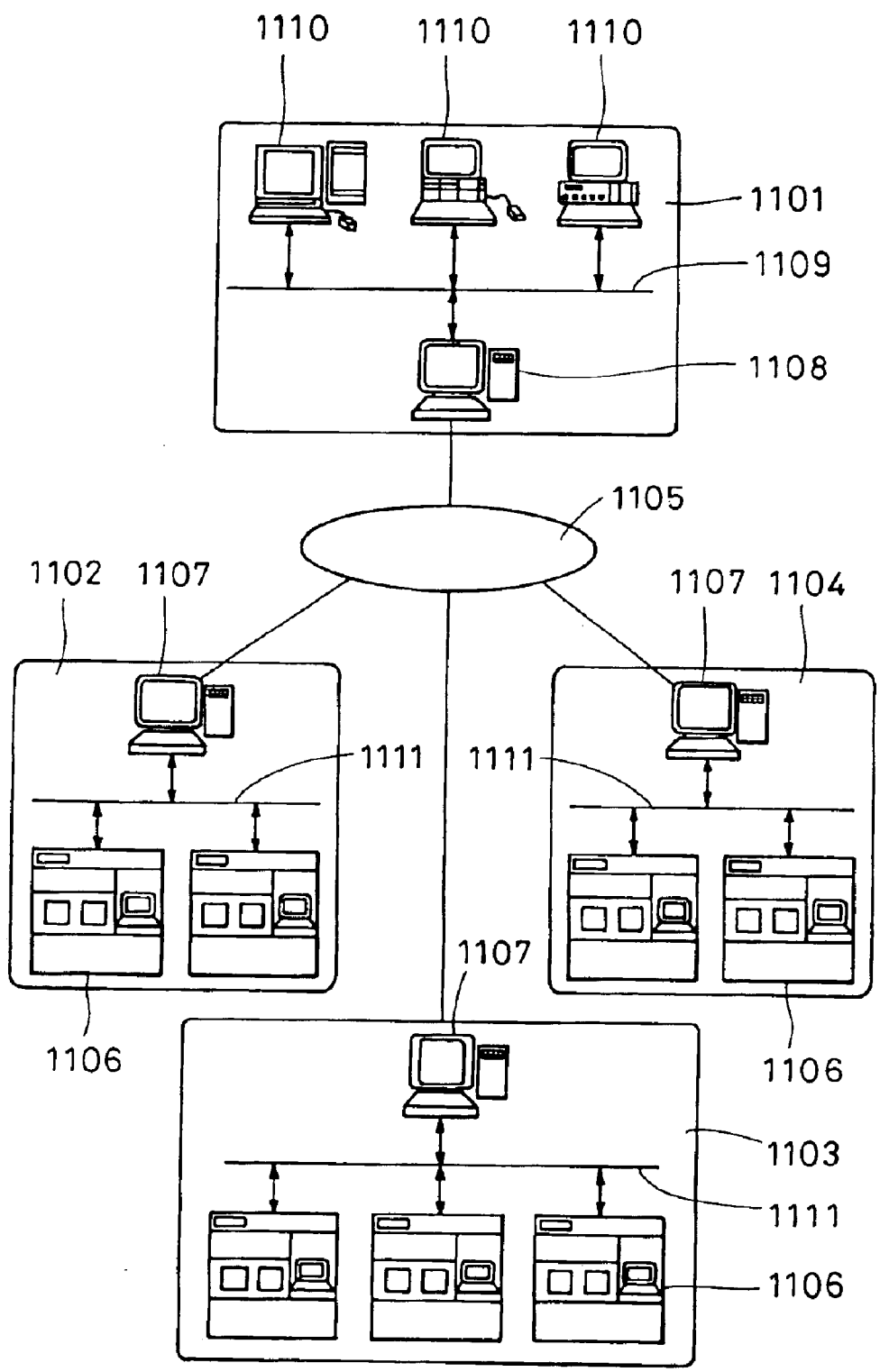
FIG. 9 is a schematic view of an overall system of a computer network.

FIG. 9 shows the overall system according to one preferred embodiment. In FIG. 9, reference numeral 1101 denotes an office of a vendor which provides semiconductor device manufacturing equipment (maker for supplying the manufacturing equipment). Exemplified as the semiconductor device manufacturing equipment is equipment used in various kinds of processes in the semiconductor manufacturing factory such as apparatuses used in an upstream process (e.g., a lithography apparatus such as an exposure apparatus, a resist processing apparatus, an etching device or the like, a heat treatment apparatus, a film forming apparatus, a flattening apparatus, or the like), and apparatuses used in a downstream process (an assembly apparatus, an inspection apparatus, and the like). A host management system 1108 for providing maintenance database of the manufacturing equipment, a plurality of operation terminal computers 1110, and a local area network (LAN) 1109 for constructing an intranet by connecting the host management system 1108 and the terminal computers 1110, are all disposed in the office 1101. The host management system 1108 includes a gateway, which connects the LAN 1109 to the Internet 1105 which serves as an external network for the office, and a security function for restricting external access.

Reference numerals 1102, 1103, and 1104 denote factories of a semiconductor manufacturing maker which use semiconductor device manufacturing equipment. The factories 1102, 1103, and 1104 may belong to different makers or may belong to the same maker (for example, factories for an upstream process and factories for a downstream process, and the like). A plurality of manufacturing apparatuses 1106, a local area network (LAN) 1111 for constructing an intranet connecting the manufacturing apparatuses 1106, and a host management system 1107 which monitors the operation of the respective manufacturing apparatuses 1106 are all disposed in each of the factories 1102, 1103, and 1104. The host management system 1107 disposed in each of the factories 1102, 1103, and 1104 includes a gateway for connecting the LAN 1111 of the factory to the Internet 1105, which serves as an external network for the factory. With this construction, it is possible for the respective factories to access the host management system 1108 of the vendor office 1101 from the LAN 1111 thereof through the Internet 1105, and access is granted only to users which are permitted by the security function of the host management system 1108. Specifically, factories can send status information (for example, trouble with a manufacturing apparatus) indicating the operating state of the respective manufacturing apparatuses 1106 to the vendor through the Internet, as well as receive information from the vendor in response (for example, information, software, or data for coping with the trouble). The factories can also receive the latest software and maintenance information such as help information from the vendor through the Internet. A communication protocol (TCP/IP) that is typically utilized in Internet communications is used for the data communication between the respective factories 1102, 1103, and 1104 and the office 1101, as well as for data communication within the LAN 1111 of each factory. Note that a private line network (e.g., ISDN and the like), which cannot be accessed by a third party, and therefore, has a high degree of security, may be used as the external network in place of the Internet. Further, the host management systems are not limited to ones provided by the vendor, and a user may construct a database and place it on the external network so as to permit a plurality of factories of the user to access the database.

Figure 10:
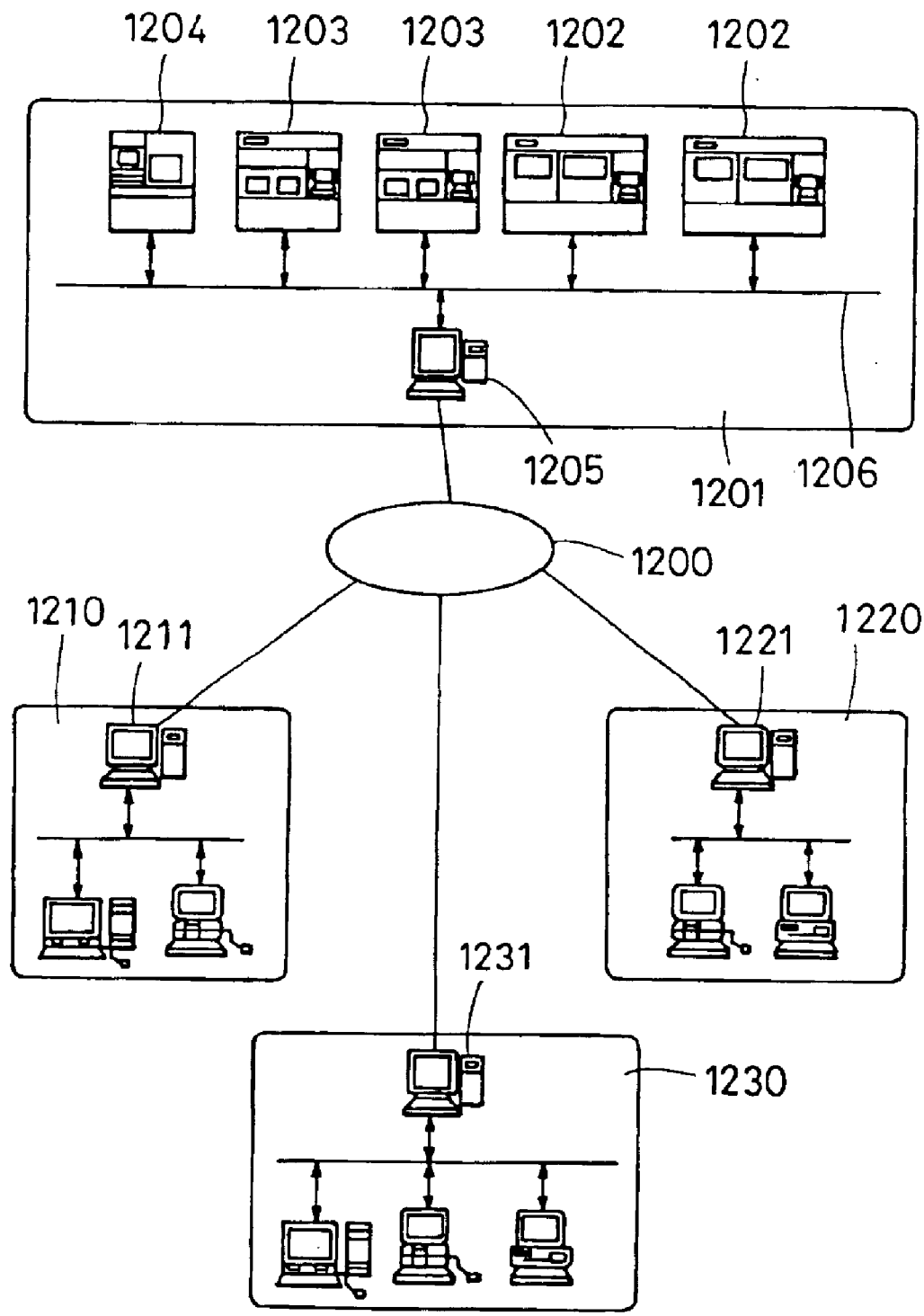
FIG. 10 is a schematic view of an overall system of a computer network.

FIG. 10 is a conceptual view of the overall system of another preferred embodiment. The previous embodiment is constructed such that the factories are connected to the management system of the vendor of the manufacturing apparatuses through the external network, and data as to the production management of the respective factories and information of at least one set of a manufacturing apparatus is transmitted through the external network. In the embodiment shown in FIG. 10, a factory including manufacturing apparatuses of a plurality of vendors is connected to the management systems of the respective vendors through an external network 1200 outside the factory, enabling the factory to transmit the maintenance information for the respective manufacturing apparatuses. In FIG. 10, reference numeral 1201 denotes the manufacturing factory of a user (semiconductor device maker) of manufacturing apparatuses, for example, an exposure apparatus 1202, a resist processing apparatus 1203, and a film forming apparatus 1204. It should be noted that while only one manufacturing factory 1201 is shown in FIG. 10, a plurality of factories are actually connected through the network. The different manufacturing apparatuses of the factory 1201 are connected by a LAN 1206 to form an intranet, and the operation of the manufacturing line is managed by a host management system 1205. The respective offices of the vendors (makers for supplying manufacturing apparatuses), such as an exposure apparatus maker 1210, a resist processing apparatus maker 1220, a film forming apparatus maker 1230 or the like, each include a host management system 1211, 1221, and 1231 having a maintenance database and a gateway to the external network for providing maintenance to the remote manufacturing apparatuses. The host management system 1205, which manages the manufacturing apparatuses within the factory of the user, is connected to the management systems 1211, 1221, and 1231 of the vendors through the Internet 1200, which serves as the external network 1200, or, alternatively, can be connected through a private line network.

In the above system, when any one the manufacturing apparatuses on a manufacturing line experiences a problem, operation of the entire manufacturing line is interrupted. However, the problem of the manufacturing apparatus can be promptly coped with by remote maintenance offered by the vendor of the manufacturing apparatus through the Internet 1200 so that the interruption to the manufacturing line can be minimized.

Each of the manufacturing apparatuses installed in the semiconductor manufacturing factory includes a display, a network interface, network accessing software stored in a memory, and a computer for executing software for operating the manufacturing apparatus. Exemplified as the memory is an integral memory, a hard disc, a network file server, or the like. The above network accessing software includes a dedicated or general-purpose web browser and provides a user interface on a display screen, an example of which is shown in FIG. 11. An operator of the manufacturing apparatuses in the factory inputs information as to the type (1401) and serial number (1402) of a manufacturing device having a problem, the name of the problem (1403), the date of occurrence (1404), a degree of emergency (1405), a sign of the trouble (406), a solving method or countermeasure (407), a progress report (408), and the like. The inputted information is transmitted to the maintenance database through the Internet. As a result, appropriate maintenance information is returned from the maintenance database through the Internet and displayed on the screen. The user interface provided by the web browser further provides hyperlink functions (1410 to 1412) as shown in FIG. 11, which permits the operator to access more detailed information for each item, to obtain the latest version of software for a manufacturing apparatus from a software library provided by the vendor, and to obtain an operation guide (help information) provided as a reference to the operator of the factory. The maintenance information provided by the maintenance management system includes information as to the oxygen concentrations in the chambers described above. Further, the software library can provide the latest software for switching between the gas supply devices and for controlling the oxygen concentration in the chambers.

Next, a process for manufacturing a semiconductor device making use of the manufacturing system described above will be explained. FIG. 12 shows a flowchart of the overall manufacturing process of the semiconductor device. At step 1 (circuit design step), a circuit of the semiconductor device is designed. At step 2 (mask making step), a mask on which a designed circuit pattern is formed is made. At step 3 (wafer making step), a wafer is made using a material such as silicon or the like. Step 4 (wafer processing step) is called an upstream process in which an actual circuit is formed on the wafer by lithography using the mask and the wafer which were prepared in previous steps. Step 5 is called a downstream process in which semiconductor chips are made using the wafer made at step 4. Specifically, step 5 includes an assembly step (dicing and bonding steps), a packaging step (chip encapsulating step), and the like. At step 6 (inspection step), inspections are carried out to confirm the operation, durability and the like of the semiconductor device made in step 5. The semiconductor device is completed through the above steps and shipped in step 7. The upstream process and the downstream process are carried out in different dedicated factories, and maintenance of the manufacturing apparatuses of each factory is performed by the remote maintenance system described above. Further, information as to production management and maintenance of the manufacturing apparatuses is also transmitted between the factory of the upstream process and the factory of the downstream process through the Internet or a private line network.

Figure 13:
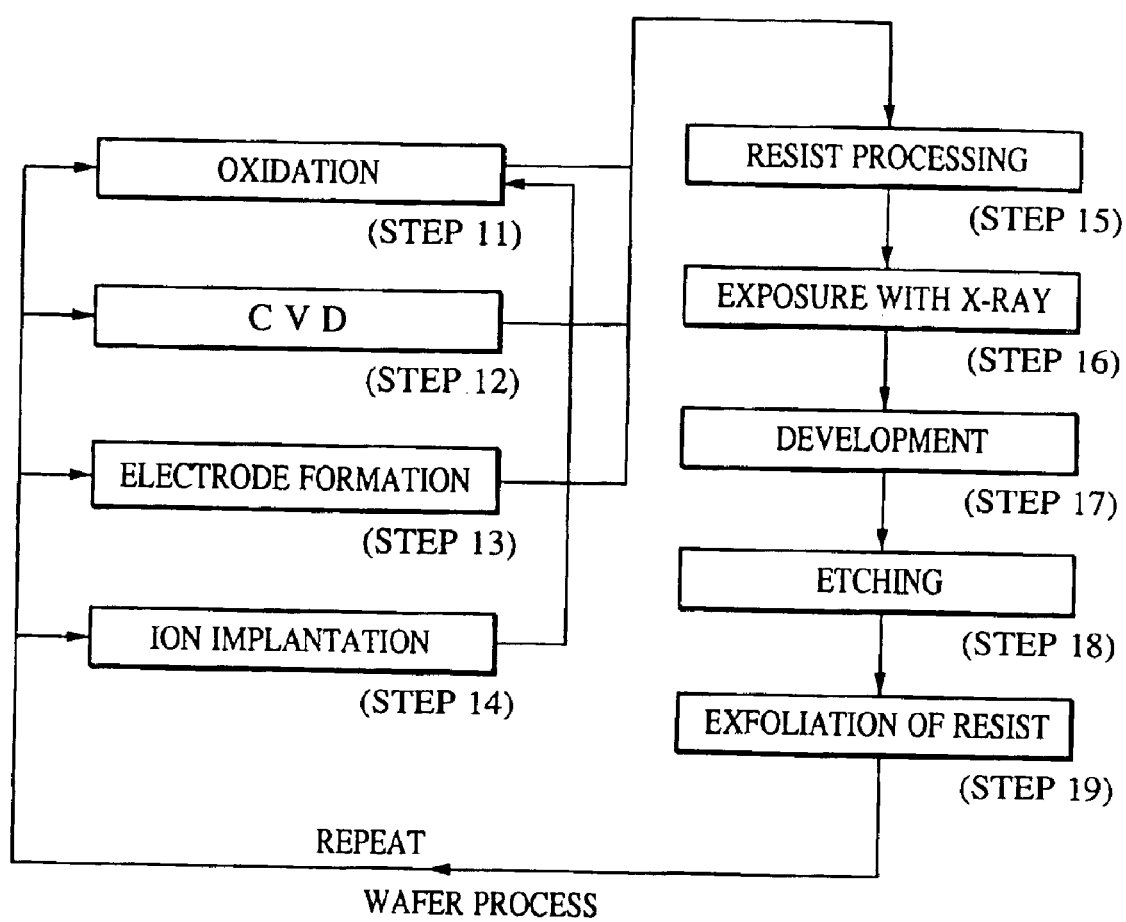
FIG. 13 is a flowchart for processing a wafer.

FIG. 13 shows a detailed flowchart of the above wafer process. At step 11 (oxidizing process), the surface of the wafer is oxidized. At step 12 (CVD process), an insulating film is formed on the surface of the wafer. At step 13 (electrode forming step), electrodes are formed on the wafer by vapor evaporation. At step 14 (ion implanting step) ions are implanted into the wafer. At step 15 (resist processing step), a light sensitive agent is coated on the wafer. At step 16 (exposing step), the circuit pattern on the mask is printed and exposed on the wafer using the above-mentioned exposure apparatus. At step 17 (developing step), the exposed wafer is developed. At step 18 (etching step), the portion of the wafer other than the developed resist image is removed by etching. At step 19 (resist exfoliating step), the resist, which is made unnecessary by the completion of the etching, is exfoliated. Repetition of the above steps permits circuit patterns to be superimposed on the wafer. Maintenance is performed on the manufacturing apparatuses used at the various steps by the remote maintenance system described above, which can prevent the occurrence of problems and, if a problem does occur with any manufacturing apparatus, the apparatus can be promptly restored to working order. Thus, the productivity of the semiconductor device manufacturing apparatus of the present invention is improved as compared with a conventional system.

Except as otherwise disposed herein, the various components shown in outline or in block form in the figures are individually well known and their internal construction and operation are not critical either to the making or using of this invention or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus, comprising:
   a chamber surrounding a predetermined space;
   a first gas supply unit for supplying a first gas into said chamber;
   a second gas supply unit for supplying a second gas, different from the first gas, into said chamber, wherein the first and second gases contain substantially no oxygen; and
   a switching mechanism for supplying one of the first and second gases by switching between said first and second gas supply units.

2. An exposure apparatus according to claim 1, wherein said chamber initially contains air, and the air in said chamber is replaced with the first gas, after which the first gas in said chamber is replaced with the second gas.

3. An exposure apparatus according to claim 1, wherein said switching mechanism is a switching valve.

4. An exposure apparatus according to claim 1, wherein an amount of the first gas supplied per unit time is different from an amount of the second gas supplied per unit time.

5. An exposure apparatus according to claim 1, wherein a flow path of the first gas in said chamber is different from a flow path of the second gas in said chamber.

6. An exposure apparatus according to claim 1, further comprising an illumination source for emitting a light beam having a wavelength in the vacuum ultraviolet region, wherein said chamber partly surrounds a light path of the light beam emitted by the illumination source.

7. An exposure apparatus according to claim 6, wherein said illumination source is one of an F2 laser and an Ar2 laser.

8. An exposure apparatus according to claim 1, wherein said chamber contains an optical element.

9. An exposure apparatus according to claim 8, wherein said chamber contains a plurality of optical elements.

10. An exposure apparatus according to claim 1, further comprising an illumination optical system, wherein said chamber surrounds a light path in said illumination optical system.

11. An exposure apparatus according to claim 1, further comprising a projection optical system, wherein said chamber surrounds a light path in said projection optical system.

12. An exposure apparatus according to claim 1, further comprising a projection optical system, wherein said chamber surrounds said projection optical system.

13. An exposure apparatus according to claim 1, wherein the first and second gases have different specific gravities.

14. An exposure apparatus according to claim 1, wherein the second gas is an inactive gas.

15. An exposure apparatus according to claim 1, wherein the first gas is an inactive gas.

16. A method of manufacturing a semiconductor device, comprising the following steps:
   installing a group of manufacturing apparatuses, including the exposure apparatus of claim 1, for performing various processes in a semiconductor manufacturing factory; and
   manufacturing the semiconductor device through a series of the various processes using the group of manufacturing apparatuses.

17. A method of manufacturing a semiconductor device according to claim 16, further comprising the following steps:
   connecting the group of manufacturing apparatuses to one another through a local area network; and
   transmitting information as to at least one manufacturing apparatus of the group of manufacturing apparatuses between the local area network and an external network outside of the semiconductor manufacturing factory by means of a data communication link.

18. A method of manufacturing semiconductor devices according to claim 17, wherein maintenance information for at least one of the group of manufacturing apparatuses is obtained by accessing a database provided by a vendor or a user of the at least one manufacturing apparatus through the external network by means of the data communication link.

19. A semiconductor manufacturing factory, comprising:
   a group of manufacturing apparatuses for performing various processes including the exposure apparatus of claim 1;
   a local area network for connecting the group of manufacturing apparatuses to one another; and
   a gateway for permitting access from said local area network to an external network outside of the semiconductor manufacturing factory,
   wherein information as to at least one manufacturing apparatus of said group of manufacturing apparatuses is transmitted by means of a data communication link.

20. A method of maintaining an exposure apparatus, comprising the steps of:
prov150ing maintenance for an exposure apparatus of claim 1, which is a database, connected to an external network of a semiconductor manufacturing factory;
permitting access to the maintenance database from the semiconductor manufacturing factory through the external network; and
transmitting information stored in the maintenance database to the semiconductor manufacturing factory through the external network.

21. An exposure apparatus according to claim 1, further comprising:
a network interface; and
a computer network, accessible via the network interface, wherein information regarding the exposure apparatus is transmitted over the computer network by means of a data communication link.

22. An exposure apparatus according to claim 21, wherein a user or a vendor of the exposure apparatus can access a maintenance database provided by the other of the user or the vendor via an external network outside of a factory where the exposure apparatus is installed and obtain information from the maintenance database via the external network.

23. A device manufacturing method, comprising:
an exposure process of exposing an object to be exposed by using the exposure apparatus claimed in claim 1; and
a developing process of developing the object to be exposed.

24. An exposure apparatus, comprising:
a chamber surrounding a predetermined space;
a first gas supply unit for supplying a first gas into said chamber;
a second gas supply unit for supplying a second gas, different from the first gas, into said chamber; and
a switching mechanism for supplying one of the first and second gases by switching between said first and second gas supply units,
wherein said chamber includes a gas supply port for the first gas and a gas supply port for the second gas, and the gas supply port for the first gas is different from the gas supply port for the second gas.

25. A device manufacturing method, comprising:
an exposure process of exposing an object to be exposed by using the exposure apparatus claimed in claim 24; and
a developing process of developing the object to be exposed.

26. An exposure apparatus, comprising:
a chamber surrounding a predetermined space;
a first gas supply unit for supplying a first gas into said chamber;
a second gas supply unit far supplying a second gas, different from the first gas, into said chamber; and
a switching mechanism for supplying one of the first and second gases by switching between said first and second gas supply units,
wherein said chamber includes a gas exhaust port for the first gas and a gas exhaust port for the second gas, and the gas exhaust port for the first gas is different from the gas exhaust port for the second gas.

27. A device manufacturing method, comprising:
an exposure process of exposing an object to be exposed by using the exposure apparatus claimed in claim 26; and
a developing process of developing the object to be exposed.

28. An exposure apparatus, comprising:
a chamber surrounding a predetermined space;
a first gas supply unit for supplying a first gas into said chamber;
a second gas supply unit for supplying a second gas, different from the first gas, into said chamber; and
a switching mechanism for supplying one of the first and second gases by switching between said first and second gas supply units,
wherein said chamber includes a ventilation port for the first gas and a ventilation port for the second gas, and the ventilation port for the first gas is disposed differently from the ventilation port for the second gas.

29. A device manufacturing method, comprising:
an exposure process of exposing an object to be exposed by using the exposure apparatus claimed in claim 28; and
a developing process of developing the object to be exposed.

30. An exposure apparatus, comprising:
a chamber surrounding a predetermined space;
a first gas supply unit for supplying a first gas into said chamber;
a second gas supply unit for supplying a second gas, different from the first gas, into said chamber; and
a switching mechanism for supplying one of the first and second gases by switching between said first and second gas supply units,
wherein the second gas is helium and the first gas is nitrogen.

31. A device manufacturing method, comprising:
an exposure process of exposing an object to be exposed by using the exposure apparatus claimed in claim 30; and
a developing process of developing the object to be exposed.

32. A gas replacement method, comprising the steps of:
supplying a first gas into a chamber surrounding a predetermined space; and
supplying a second gas, different from the first gas, into the chamber, after the first gas is supplied,
wherein the first and second gases contain substantially no oxygen and one of the first gas and the second gas is supplied into the chamber by switching between a first gas supply unit for supplying the first gas and a second gas supply unit for supplying the second gas.

33. A gas replacement method according to claim 32, wherein a valve is used to switch between the first gas and the second gas.

34. A gas replacement method according to claim 32, wherein an amount of the first gas supplied per unit time is different from an amount of the second gas supplied per unit time.

35. A gas replacement method according to claim 32, wherein a flow path of the first gas in the chamber is different from a flow path of the second gas in the chamber.

36. A gas replacement method according to claim 32, wherein the chamber partly surrounds a light path of a light beam emitted from an illumination source, the light beam having a wavelength in the vacuum ultraviolet region.

37. A gas replacement method according to claim 36, wherein the illumination source is one of an F2 laser and an Ar2 laser.

38. A gas replacement method according to claim 32, wherein an optical element is contained in the chamber.

39. A gas replacement method according to claim 38, wherein a plurality of the optical elements are contained in the chamber.

40. A gas replacement method according to claim 32, wherein the chamber surrounds a light path in an illumination optical system of an exposure apparatus.

41. A gas replacement method according to claim 32, wherein the chamber surrounds a light path in a projection optical system of an exposure apparatus.

42. A gas replacement method according to claim 32, wherein the chamber surrounds a projection optical system of an exposure apparatus.

43. A gas replacement method according to claim 32, wherein the first and second gases have different specific gravities.

44. A gas replacement method according to claim 32, wherein the second gas is an inactive gas.

45. A gas replacement method according to claim 32, wherein the first gas is an inactive gas.

46. An exposing apparatus wherein a gas replacement is performed in accordance with the replacement method claimed in claim 32.

47. A device manufacturing method, comprising:
an exposure process of exposing an object to be exposed by using the exposure apparatus claimed in claim 46; and
a developing process of developing the object to be exposed.

48. A gas replacement method, comprising the steps of:
supplying a first gas into a chamber surrounding a predetermined space; and
supplying a second gas, different from the first gas, into the chamber, after the first gas is supplied,
wherein a gas supply port for supplying the first gas in the chamber is different from a gas supply port for supplying the second gas in the chamber.

49. An exposing apparatus wherein gas replacement is performed in accordance with the gas replacement method claimed in claim 48.

50. A device manufacturing method, comprising:
an exposure process of exposing an object to be exposed by using the exposure apparatus claimed in claim 49; and
a developing process of developing the object to be exposed.

51. A gas replacement method, comprising the steps of:
supplying a first gas into a chamber surrounding a predetermined space; and
supplying a second gas, different from the first gas, into the chamber, after the first gas is supplied,
wherein a gas exhaust port for exhausting the first gas from the chamber is different from a gas exhaust port for exhausting the second gas from the chamber.

52. A gas replacement method, comprising the steps of:
supplying a first gas into a chamber surrounding a predetermined space; and
supplying a second gas, different from the first gas, into the chamber, after the first gas is supplied,
wherein a ventilation port for the first gas in the chamber is disposed differently from a ventilation port for the second gas in the chamber.

53. An exposing apparatus wherein gas replacement is performed in accordance with the gas replacement method claimed in claim 52.

54. A device manufacturing method, comprising:
an exposure process of exposing an object to be exposed by using the exposure apparatus claimed in claim 53; and
a developing process of developing the object to be exposed.

55. A gas replacement method, comprising the steps of:
supplying a first gas into a chamber surrounding a predetermined space; and
supplying a second gas, different from the first gas, into the chamber, after the first gas is supplied,
wherein the second gas is helium and the first gas is nitrogen.

56. An exposure apparatus, comprising:
a chamber surrounding a predetermined space;
a first gas supply source for supplying a first gas into said chamber; and
a second gas supply source for supplying a second gas, different from the first gas, into said chamber,
wherein said chamber initially has a substantial oxygen content, but after the first gas and the second gas are sequentially supplied into said chamber, said chamber no longer has a substantial oxygen content,
wherein the first gas is nitrogen and the second gas is helium.

57. A device manufacturing method, comprising:
an exposure process of exposing an object to be exposed by using the exposure apparatus claimed in claim 56; and
a developing process of developing the object to be exposed.

58. An exposure apparatus, comprising:
a chamber surrounding a predetermined space;
a first gas supply source for supplying a first gas into said chamber; and
a second gas supply source for supplying a second gas, different from the first gas, into said chamber,
wherein said chamber initially has a substantial oxygen content, but after the first gas and the second gas are sequentially supplied into said chamber, said chamber no longer has a substantial oxygen content,
wherein the first gas is supplied into the chamber until the oxygen content in said chamber is reduced to less than about 0.00001 percent by volume, after which the second gas is supplied into said chamber until a concentration of the first gas in said chamber is reduced to less than about ten percent by volume.

59. A device manufacturing method, comprising:
an exposure process of exposing an object to be exposed by using the exposure apparatus claimed in claim 58; and
a developing process of developing the object to be exposed.

60. An exposure apparatus, comprising:
a chamber surrounding a predetermined space;
a first gas supply source for supplying a first gas into said chamber; and a second gas supply source for supplying a second gas, different from the first gas, into said chamber, wherein said chamber initially has a substantial oxygen content, but after the first gas and the second gas are sequentially supplied into said chamber, said chamber no longer has a substantial oxygen content, wherein the first gas is supplied into the chamber until the oxygen content in said chamber is reduced to about 0.000001 percent by volume or less, after which the second gas is supplied into said chamber until a concentration of the first gas in said chamber is reduced to about one percent by volume or less.

61. A device manufacturing method, comprising:

an exposure process of exposing an object to be exposed by using the exposure apparatus claimed in claim 60; and a developing process of developing the object to be exposed.

62. A method of reducing the oxygen content in a chamber that initially contains air, said method comprising the following steps:

first supplying a first gas into the chamber to substantially replace the air in the chamber;

next supplying a second gas, different from the first gas, into the chamber to substantially replace the first gas in the chamber, wherein after the first gas and second gas have been sequentially supplied into the chamber, the chamber no longer has a substantial oxygen content, wherein the first gas is nitrogen and the second gas is helium.

63. A method of reducing the oxygen content in a chamber that initially contains air, said method comprising the following steps:

first supplying a first gas into the chamber to substantially replace the air in the chamber;

next supplying a second gas, different from the first gas, into the chamber to substantially replace the first gas in the chamber, wherein after the first gas and second gas have been sequentially supplied into the chamber, the chamber no longer has a substantial oxygen content, wherein the first gas is supplied into the chamber until the oxygen content in the chamber is reduced to less than about 0.00001 percent by volume, and the second gas is supplied into the chamber until a concentration of the first gas in the chamber is reduced to less than about ten percent by volume.

64. A method of reducing the oxygen content in a chamber that initially contains air, said method comprising the following steps:

first supplying a first gas into the chamber to substantially replace the air in the chamber;

next supplying a second gas, different from the first gas, into the chamber to substantially replace the first gas in the chamber, wherein after the first gas and second gas have been sequentially supplied into the chamber, the chamber no longer has a substantial oxygen content, wherein the first gas is supplied into the chamber until the oxygen content in the chamber is reduced to about 0.000001 percent by volume or less, and the second gas is supplied into the chamber until a concentration of the first gas in the chamber is reduced to about one percent by volume or less.

65. An exposure apparatus comprising:

a chamber;

a first gas supply unit for supplying a first gas into said chamber; and a second gas supply unit for supplying a second gas, different from the first gas, into said chamber, wherein the first gas has a higher molecular weight than the second gas, a supply of the first gas into said chamber starts before a supply of the second gas into said chamber starts and the first gas and the second gas contain substantially no oxygen.

66. An exposure apparatus according to claim 65, wherein said first gas is nitrogen and said second gas is helium.

67. An exposure apparatus according to claim 66, wherein said first gas supply unit replaces atmosphere in said chamber with nitrogen, after which said second gas supply unit replaces the nitrogen with helium.

68. An exposure apparatus according to claim 66, wherein said first gas supply unit replaces air in said chamber with nitrogen, after which said second gas supply unit replaces the nitrogen with helium.

69. An exposure apparatus according to claim 65, wherein said first and second gases contain substantially no oxygen.

70. A device manufacturing method comprising:

an exposure process of exposing an object to be exposed by using the exposure apparatus claimed in claim 65; and a developing process of developing the object to be exposed by using said exposure apparatus.

71. An exposure apparatus, comprising:

a chamber;

a nitrogen supply unit for supplying nitrogen into said chamber; and a helium supply unit for supplying helium into said chamber, wherein said nitrogen supply unit replaces atmosphere in said chamber with nitrogen, after which said helium supply unit replaces the nitrogen with helium.

72. A device manufacturing method comprising:

an exposure process of exposing an object to be exposed by using the exposure apparatus claimed in claim 71; and a developing process of developing the object to be exposed by using the exposure apparatus.

73. A gas replacement method, comprising the steps of:

a first supplying step for supplying a first gas into a chamber; and a second supplying step for supplying a second gas, different from the first gas, into said chamber, wherein said first gas has a higher molecular weight, said first supplying step starts before said second supplying step starts, and wherein the first and second gases contain substantially no oxygen.

74. A gas replacement method according to claim 73, wherein said first gas is nitrogen and said second gas is helium.

75. A gas replacement method according to claim 73, wherein said first supplying step completes, after which said second supplying step starts.

76. A gas replacement method according to claim 73, wherein said first supplying step replaces atmosphere in said chamber with nitrogen, after which said second supplying step replaces the nitrogen with helium.

77. A gas replacement method according to claim 73, wherein said first supplying step replaces air in said chamber with nitrogen, after which said second supplying step replaces the nitrogen with helium.

78. A gas replacement method according to claim 73, wherein said first and second gases contain substantially no oxygen.

79. A device manufacturing method comprising:
- a replacement process of replacing atmosphere in said chamber with said second gas by using a method according to the gas replacement method claimed in claim 73;
- an exposure process of exposing an object to be exposed by using optical elements disposed in said space; and
- a developing process of developing the object to be exposed by using the optical elements.

80. A gas replacement method, comprising the steps of:
- a first step for replacing atmosphere in a chamber with nitrogen; and
- a second step for replacing the nitrogen in said chamber with helium after said first step.

81. A device manufacturing method comprising:
- a replacement process of replacing atmosphere in said chamber with helium by using a method according to the gas replacement method claimed in claim 80;
- an exposure process of exposing an object to be exposed by using optical elements disposed in said space; and
- a developing process of developing the object to be exposed by using the optical elements.

82. An exposure apparatus comprising:
- a chamber;
- a first gas supply unit for supplying a first gas into said chamber;
- a second gas supply unit for supplying a second gas, different from the first gas, into said chamber; and
- a switching mechanism for switching between a supply of the first gas from said first gas supply unit and a gas supply of the second gas from said second gas supply unit,
- wherein the first gas has a higher molecular weight than the second gas, a supply of the first gas into said chamber starts before a supply of the second gas into said chamber starts and the first gas and the second gas contain substantially no oxygen.

83. An apparatus according to claim 82, wherein the switching mechanism switches supply of said first gas from said first gas supply unit to supply of said second gas from said second gas supply unit.

84. A device manufacturing method, comprising:
- an exposure process of exposing an object to be exposed by using the exposure apparatus claimed in claim 82; and
- a developing process of developing the object to be exposed.

85. A gas replacement method, comprising the steps of:
- supplying a first gas into a chamber surrounding a predetermined space; and
- supplying a second gas, different from the first gas, into the chamber, after the first gas is supplied,
- wherein the first and second gases contain substantially no oxygen and the first gas is heavier than the second gas.

86. An exposing apparatus wherein gas replacement is performed in accordance with the gas replacement method claimed in claim 85.

87. A device manufacturing method, comprising:
- an exposure process of exposing an object to be exposed by using the exposure apparatus claimed in claim 86; and
- a developing process of developing the object to be exposed.

* * * * *

UNITED STATES PATENT AND TRADEMARK OFFICE
CERTIFICATE OF CORRECTION

PATENT NO. : 6,873,397 B2
DATED : March 29, 2005
INVENTOR(S) : Shuichi Yabu

It is certified that error appears in the above-identified patent and that said Letters Patent is hereby corrected as shown below:

Title page,
Item [56], References Cited, OTHER PUBLICATIONS, "Korean Office Action dated Aug. 1, 2003, issued In a corresponding Korean pat nt application." should read
-- Korean Office Action dated Aug. 1, 2003, issued in a corresponding Korean patent application. --.

Column 1,
Line 38, "gas i.e.," should read -- gas (i.e., --.

Column 13,
Line 11, "be" should be deleted.
Line 13, "operable/closable" should read -- openable/closable --.
Line 37, "nitrogen" should read -- a nitrogen --.

Column 17,
Line 45, "a very" should read -- very --.

Column 19,
Line 53, "detecting" should read -- detected --.

Column 25,
Line 30, "disposed" should read -- disclosed --.

UNITED STATES PATENT AND TRADEMARK OFFICE
CERTIFICATE OF CORRECTION

PATENT NO. : 6,873,397 B2
DATED : March 29, 2005
INVENTOR(S) : Shuichi Yabu

It is certified that error appears in the above-identified patent and that said Letters Patent is hereby corrected as shown below:

Column 32,
Line 52, "molecular weight" should read -- molecular weight than said second gas, and --.
Line 62, "completes," should read -- is completed, --.

Signed and Sealed this

Twenty-third Day of August, 2005

JON W. DUDAS
*Director of the United States Patent and Trademark Office*